(12) United States Patent
Kim

(10) Patent No.: US 10,573,793 B2
(45) Date of Patent: Feb. 25, 2020

(54) LIGHT EMITTING DIODE PACKAGE AND DISPLAY APPARATUS INCLUDING THE SAME

(71) Applicant: Seoul Semiconductor Co., Ltd., Ansan-si (KR)

(72) Inventor: Eun Ju Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 115 days.

(21) Appl. No.: 15/792,533

(22) Filed: Oct. 24, 2017

(65) Prior Publication Data

US 2018/0114884 A1  Apr. 26, 2018

Related U.S. Application Data

(60) Provisional application No. 62/412,574, filed on Oct. 25, 2016, provisional application No. 62/435,043, filed on Dec. 15, 2016.

(51) Int. Cl.
*H01L 33/52* (2010.01)
*G02F 1/1335* (2006.01)
*H01L 33/46* (2010.01)
*H01L 33/60* (2010.01)
*H01L 33/50* (2010.01)

(52) U.S. Cl.
CPC ........ *H01L 33/52* (2013.01); *G02F 1/133603* (2013.01); *G02F 1/133605* (2013.01); *H01L 33/46* (2013.01); *H01L 33/60* (2013.01); *H01L 33/505* (2013.01); *H01L 33/507* (2013.01)

(58) Field of Classification Search
CPC ... H01L 33/46; H01L 33/60; G02F 1/133603; G02F 1/133605
See application file for complete search history.

(56) References Cited

U.S. PATENT DOCUMENTS

| 8,507,299 B2 | 8/2013 | Joo et al. |
| 8,643,041 B2 | 2/2014 | Lee |
| 2014/0203306 A1* | 7/2014 | Ito .......................... H01L 33/505 257/88 |

(Continued)

FOREIGN PATENT DOCUMENTS

| KR | 10-2011-0125065 | 11/2011 |
| KR | 10-2014-0028964 | 3/2014 |

(Continued)

*Primary Examiner* — Anh T Mai
*Assistant Examiner* — Nathaniel J Lee
(74) *Attorney, Agent, or Firm* — H.C. Park & Associates, PLC

(57) ABSTRACT

A light emitting diode package and a display apparatus including the same. The light emitting diode package includes a light emitting diode chip, a reflector disposed on an upper surface of the light emitting diode chip and configured to reflect some light emitted from the light emitting diode chip, and a molding part disposed to cover an upper surface and a side surface of the light emitting diode chip and disposed to cover an upper surface and a side surface of the reflector. The light emitting diode package employs the reflector, which is disposed on the light emitting diode chip acting as a light source for a backlight unit of a display apparatus and is enclosed by the molding part, and thus can be used as a direct type backlight unit without a separate lens.

31 Claims, 20 Drawing Sheets

(56) References Cited

U.S. PATENT DOCUMENTS

2016/0087159 A1* 3/2016 Kim .................. H01L 33/46
257/98

FOREIGN PATENT DOCUMENTS

| KR | 10-2015-0048578 | | 5/2015 |
| KR | 10-1521260 | | 5/2015 |
| KR | 20150048578 A | * | 5/2015 |
| KR | 10-2015-0075782 | | 7/2015 |
| KR | 10-2016-0005827 | | 1/2016 |
| KR | 10-2016-0051566 | | 5/2016 |
| KR | 10-2016-0065349 | | 6/2016 |

* cited by examiner

FIG. 7A

| | Illuminance Image @OD=2mm |
|---|---|
| ref. | |
| DBR R=90% | |
| DBR R=100% | |

LIGHT EMITTING DIODE PACKAGE AND DISPLAY APPARATUS INCLUDING THE SAME

CROSS-REFERENCE TO RELATED APPLICATION

This application claims priority from and the benefit of U.S. Provisional Patent Application No. 62/412,574, filed on Oct. 25, 2016, and U.S. Provisional Patent Application No. 62/435,043, filed on Dec. 15, 2016, both of which are incorporated by reference for all purposes as if fully set forth herein.

BACKGROUND

Field

Exemplary embodiments of the present invention relate to a light emitting diode package and a display apparatus including the same. More particularly, exemplary embodiments relate to a light emitting diode package that emits light in a direct type backlight unit of a display apparatus. Exemplary embodiments also relate to a display apparatus including the light emitting diode package.

Discussion of the Background

Consumer demand has increased for thin display apparatuses. To meet that demand, a liquid crystal display (LCD) typically includes an edge type backlight unit with a light source disposed at one edge of the LCD.

However, a liquid crystal display including such an edge type backlight unit cannot realize high dynamic range (HDR) imaging. HDR imaging is a method of producing images on a display screen that simulates a range of luminance similar to what is viewed through the human visual system. In order to realize HDR, it is necessary to realize a difference in luminance of light emitted through the display apparatus depending upon locations on a display screen. However, the liquid crystal display using the edge type backlight unit cannot realize a difference in luminance of light depending upon locations on the display screen.

Accordingly, various studies have been made to realize HDR through implementation of an active matrix type using a direct type backlight unit. One example of these studies is disclosed in Korean Patent Publication No. 10-2016-0051566 (2016 May 11, hereinafter "Prior Document"). However, this publication discloses a display apparatus using a direct type backlight unit with a lens disposed to spread light emitted from a light emitting diode in a lateral direction. Because the lens is used, a display apparatus must be thicker in order to include the lens along with the direct type back light unit. Put another way, the display apparatus is limited in how thin it can be based on the lens.

The above information disclosed in this Background section is only for enhancement of understanding of the background of the inventive concepts, and, therefore, it is may contain information that does not form the prior art.

SUMMARY

Exemplary embodiments of the invention may provide a light emitting diode package that adopts a direct type backlight to reduce the thickness of a display apparatus. Exemplary embodiments may provide a display apparatus that includes the light emitting diode package.

In an exemplary embodiment, a light emitting diode package includes: a light emitting diode chip; a reflector disposed on an upper surface of the light emitting diode chip and configured to reflect some light emitted from the light emitting diode chip; and a molding part disposed to cover an upper surface and a side surface of the light emitting diode chip and disposed to cover an upper surface and a side surface of the reflector.

In an exemplary embodiment, a light emitting diode package may include: a light emitting diode chip; a reflector disposed on an upper surface of the light emitting diode chip and configured to reflect some light emitted from the light emitting diode chip; and a molding part disposed on a side surface of the light emitting diode chip.

In an exemplary embodiment, a display apparatus includes: a frame; a plurality of light emitting diode packages regularly arranged on the frame; and an optical part disposed above the plurality of light emitting diode packages and including a display panel and at least one of a phosphor sheet and an optical sheet, wherein each light emitting diode package, among the plurality of the light emitting diode packages, includes a light emitting diode chip; a reflector disposed on an upper surface of the light emitting diode chip and configured to reflect some light emitted from the light emitting diode chip; and a molding part disposed to cover an upper surface and a side surface of the light emitting diode chip and disposed to cover an upper surface and a side surface of the reflector.

In an embodiment, a display apparatus may include a frame, a plurality of light emitting diode packages regularly arranged on the frame, and an optical part disposed above the plurality of light emitting diode packages and including a display panel and at least one of a phosphor sheet and an optical sheet, wherein each light emitting diode package, among the plurality of light emitting diode packages, includes: a light emitting diode chip, a reflector disposed on an upper surface of the light emitting diode chip and configured to reflect some light emitted from the light emitting diode chip; and a molding part disposed on a side surface of the light emitting diode chip.

According to exemplary embodiments, the light emitting diode package employs the reflector, which is disposed on the light emitting diode chip acting as a light source for a backlight unit of a display apparatus and is enclosed by the molding part, and thus can be used as a direct type backlight unit without a separate lens.

In addition, exemplary embodiments provide a thinner direct type backlight than a typical direct type backlight unit through elimination of a separate lens, thereby enabling reduction in thickness of a display apparatus.

Furthermore, a molding part surrounding the light emitting diode chip may have a dual structure and at least one molding portion of the molding part may contain at least one kind of phosphor, thereby enabling easy control with respect to colors of light emitted from the light emitting diode package. Particularly, among the molding portions of the molding part in the light emitting diode package, an outer molding portion may contain at least one kind of phosphor, thereby enhancing thermal characteristics of the light emitting diode package.

Furthermore, the light emitting diode package may include a first reflector disposed at the center of the upper surface of the light emitting diode chip and a second reflector disposed to surround the first reflector, in which the first reflector has a different reflectivity than the second reflector, thereby improving efficiency in spreading light emitted from the light emitting diode package in a lateral direction thereof.

Furthermore, a side surface of the molding part of the light emitting diode package may be formed to have an inclined surface, thereby improving efficiency in spreading light emitted from the light emitting diode package.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

FIG. 7A shows actual images of light for comparing central illuminance depending upon reflectivity of the reflector in the light emitting diode package according to the first exemplary embodiment.

DETAILED DESCRIPTION OF THE ILLUSTRATED EXEMPLARY EMBODIMENTS

Figure 1A:
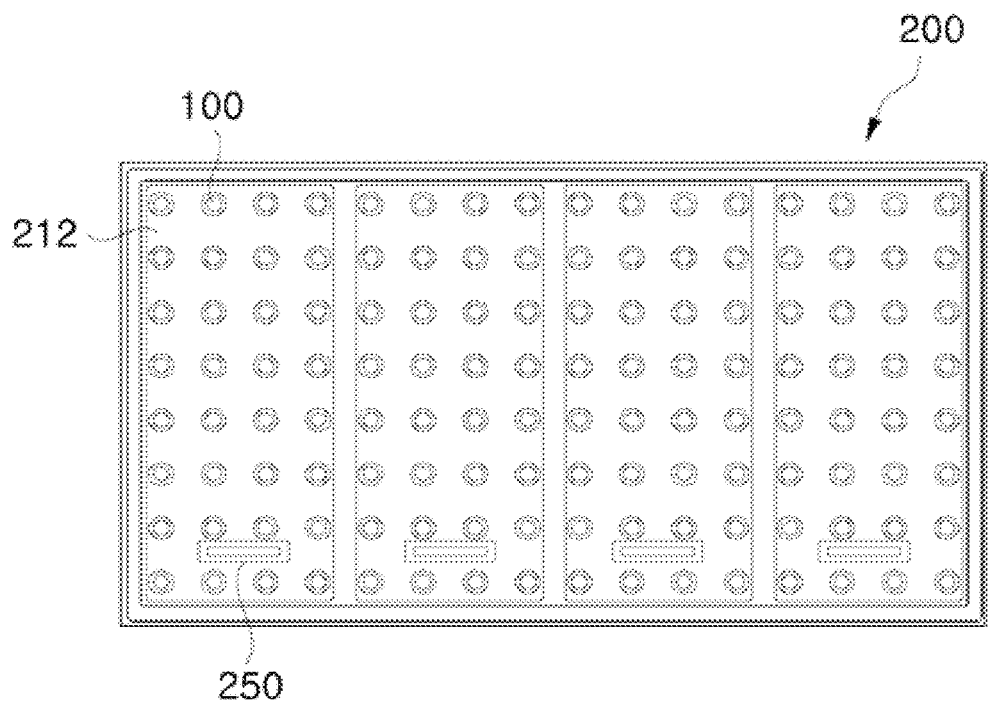
FIG. 1A is a top view of a display apparatus according to a first exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not necessarily intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Exemplary embodiments of the present disclosure will be described in more detail with reference to the accompanying drawings.

Figure 1B:
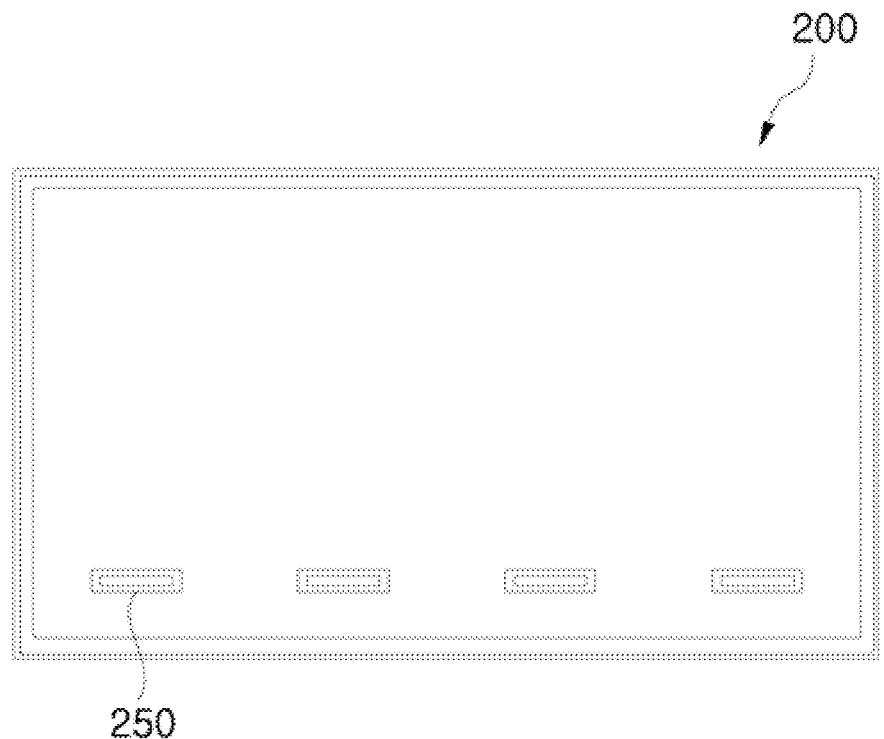
FIG. 1B is a bottom view of the display apparatus according to the first exemplary embodiment.
Figure 2A:
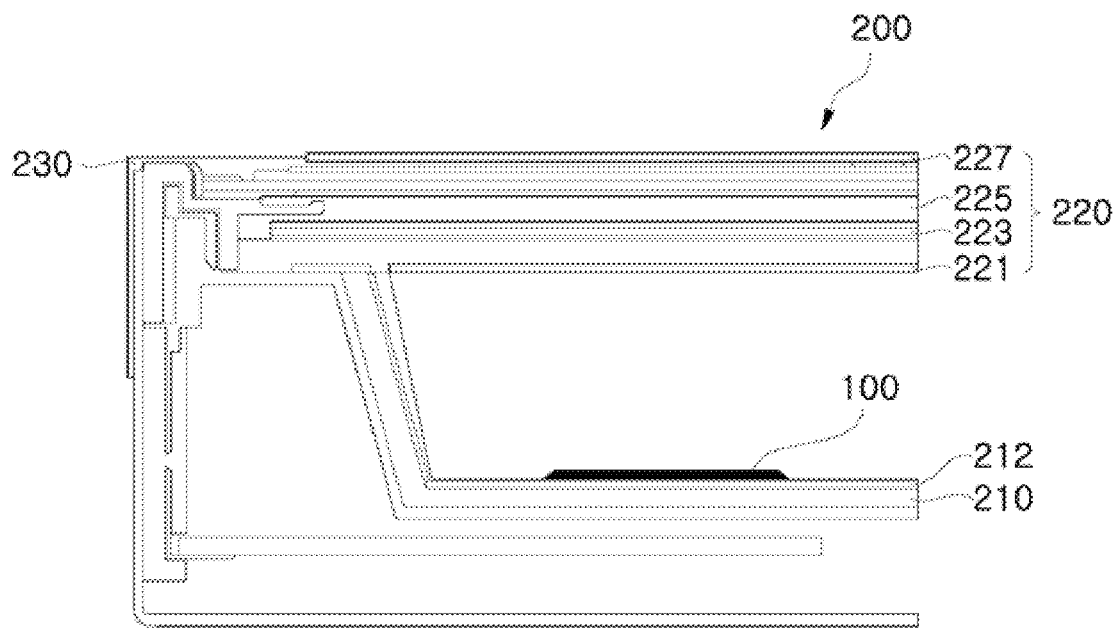
FIG. 2A and FIG. 2B are cross-sectional views of the display apparatus according to the first exemplary embodiment.
Figure 2B:
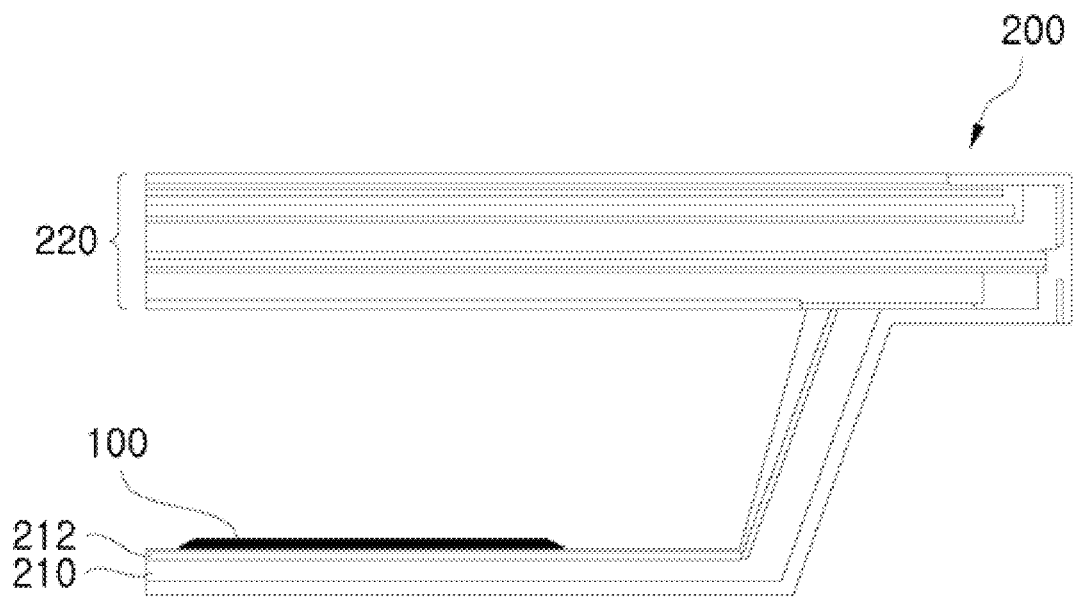

FIG. 1A is a top view of a display apparatus according to a first exemplary embodiment and FIG. 1B is a bottom view of the display device according to the first exemplary embodiment. FIG. 2A and FIG. 2B are cross-sectional views of the display apparatus according to the first exemplary embodiment.

A display apparatus 200 according to the first exemplary embodiment includes light emitting diode packages 100, a front cover 230, a frame 210, and an optical part 220. Each of the light emitting diode packages 100 includes a light emitting diode chip 112, a reflector 114, and a molding part 116, which will be described below.

The front cover 230 may cover part of side and upper surfaces of a display panel 227 of the optical part 220. The front cover 230 may have a hollow center and the display panel 227 may be disposed at the center of the front cover 230 such that an image displayed on the display panel 227 can be viewed outside the display apparatus.

The frame 210 may support the display apparatus 200 and may be coupled to the front cover 230 at one side of the frame 210. The frame 210 may be formed of a synthetic resin or a metallic material such as an Al alloy. The frame 210 may be separated a predetermined distance from the optical part 220. The light emitting diode package 100 may be disposed on the frame 210 so as to face the optical part 220. Here, a distance between the frame 210 and the optical part 220 may be an optical distance (OD) from the light emitting diode package 100 to the optical part 220. In this exemplary embodiment, the optical distance (OD) may be, for example, about 1 mm to 15 mm.

A substrate 212 may be disposed on an upper surface of the frame 210. The substrate 212 may be electrically connected to the light emitting diode package 100. Power may be supply through the substrate 212 to the light emitting diode package 100.

The optical part 220 is disposed above the frame 210, and includes a phosphor sheet 221, a diffusion plate 223, an optical sheet 225 and the display panel 227.

The phosphor sheet 221 serves to perform wavelength conversion of light emitted from the light emitting diode package 100. The phosphor sheet 221 may contain at least one kind of phosphor and may further include at least one kind of quantum dot (QD). In this exemplary embodiment, the light emitting diode package 100 may emit blue light or UV light, and light emitted through the phosphor sheet 221 may be white light.

The diffusion plate 223 serves to diffuse light in an upward direction when receiving the light from the light emitting diode package 100.

The optical sheet 225 may be disposed on the diffusion plate 223 and the display panel 227 may be disposed on the optical sheet 225. The optical sheet 225 may include a plurality of sheets having different functions. By way of example, the optical sheet 225 may include one or more prism sheets and diffusion sheets. The diffusion sheet can provide more uniform brightness by preventing light emitted through the diffusion plate 223 from being partially collected. The prism sheet can collect light emitted through the diffusion sheet to allow the light to enter the display panel 227 at a right angle.

The display panel 227 is disposed on an upper surface of the display apparatus 200 and displays an image. The display panel 227 includes a plurality of pixels and can output an image corresponding to a color, brightness, and chroma of each pixel.

Referring to FIG. 1A, the display apparatus 200 includes a plurality of light emitting diode packages 100 regularly arranged thereon. By way of example, the light emitting diode packages 100 may be arranged in a matrix to be separated at constant intervals from each other.

FIG. 1A shows the structure wherein a plurality of light emitting diode packages 100 is regularly arranged. The display apparatus 200 can provide higher quality HDR (high dynamic range) by increasing the number of light emitting diode packages 100.

In addition, the display apparatus may be provided with a plurality of power supply units 250, which supply electric power to the plurality of light emitting diode packages 100. Each power supply unit 250 can supply power to at least one light emitting diode package 100. In this exemplary embodiment, electric power is supplied to 32 light emitting diode packages 100 through one power supply unit 250. Upon receiving electric power from the power supply unit 250, the plurality of light emitting diode packages 100 can emit light and be individually operated.

Figure 3:
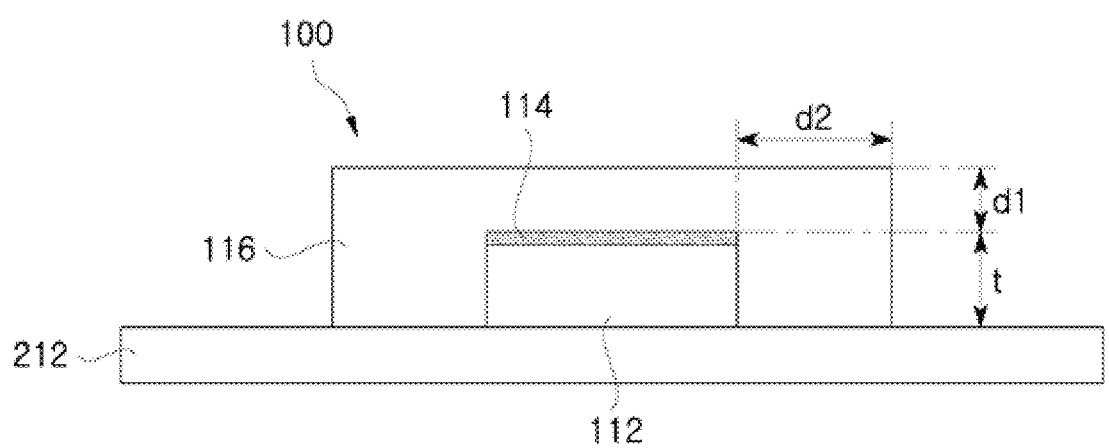
FIG. 3 is a sectional view of a light emitting diode package of the display apparatus according to the first exemplary embodiment.

FIG. 3 is a sectional view of the light emitting diode package according to the first exemplary embodiment.

Referring to FIG. 3, the light emitting diode package 100 according to the first exemplary embodiment will be described in more detail. As shown in FIG. 3, the light emitting diode package 100, disposed on the substrate 212, includes a light emitting diode chip 112, a reflector 114, and a molding part 116.

The light emitting diode chip 112 may include an n-type semiconductor layer, an active layer, and a p-type semiconductor layer. Here, each of the n-type semiconductor layer, the active layer and the p-type semiconductor layer may include a Group III-V-based compound semiconductor. By way of example, each of the n-type semiconductor layer, the active layer and the p-type semiconductor layer may include a nitride semiconductor such as (Al, Ga, In)N.

The n-type semiconductor layer may be a conductive semiconductor layer containing n-type dopants (for example, Si) and the p-type semiconductor layer may be a conductive semiconductor layer containing p-type dopants (for example, Mg). The active layer is interposed between the n-type semiconductor layer and the p-type semiconductor layer, and may have a multi-quantum well (MQW) structure. The composition of the active layer may be determined so as to emit light having a desired peak wavelength.

In this exemplary embodiment, the light emitting diode chip 112 may be a flip-chip type light emitting diode chip 112. In this structure, an n-type electrode may be electrically connected to the n-type semiconductor layer of the light emitting diode chip 112 and a p-type electrode may be electrically connected to the p-type semiconductor layer of the light emitting diode chip 112.

When light is emitted from the light emitting diode chip 112, the light is emitted through upper and side surfaces of the light emitting diode chip 112. In this exemplary embodiment, the light emitting diode chip 112 may have a size of, for example, 670 µm×670 µm×250 µm (length×width× thickness).

The reflector 114 may be disposed on the light emitting diode chip 112 so as to cover the entirety of an upper surface of the light emitting diode chip 112. In this exemplary embodiment, the reflector 114 may reflect light emitted from the light emitting diode chip 112 or may allow some fractions of light emitted from the light emitting diode chip 112 to be transmitted through the reflector 114 while reflecting the remaining fraction of the light.

By way of example, the reflector 114 may include a distributed Bragg reflector (DBR). The distributed Bragg reflector may be formed by alternately stacking material layers having different indices of refraction. The distributed Bragg reflector can reflect the entirety or part of light emitted from the light emitting diode chip 112 depending upon the number of material layers constituting the distributed Bragg reflector. In addition, the reflector 114 may include a metal or other materials, instead of the distributed Bragg reflector, as needed. For example, the reflector 114 may have a light transmittance of 0% to 80%.

The distributed Bragg reflector may have a structure in which two or more dielectric layers having different indexes of refraction are alternately stacked one above another. Each of the two or more dielectric layers may be formed of an oxide or a nitride of an element selected from the group consisting of Si, Zr, Ta, Ti and Al. Specifically, each of the dielectric layers may include at least one of AlGaN, GaN, $SiO_2$, SiN, $Si_3N_4$, $SiO_xN_y$, $TiO_2$, TiN, TiAlN, TiSiN, AlN, $Al_2O_3$, $ZrO_2$, and MgO.

Each of the two or more dielectric layers may have a thickness of $\lambda/4n$. Here, $\lambda$ denotes the wavelength of light emitted from an active layer and n denotes an index of refraction of the corresponding dielectric layer. Accordingly, the distributed Bragg reflector may have a thickness of about 300 Å to 900 Å. The distributed Bragg reflector may include 20 to 50 pairs of dielectric layers, without being limited thereto. In this exemplary embodiment, the indexes of refraction and thicknesses of the two or more dielectric layers may be determined depending upon transmittance of the reflector 114.

In addition, the distributed Bragg reflector has the structure in which two or more dielectric layers having different indexes of refraction are alternately stacked one above another, and may have higher band-gap energy than the energy of light emitted from the light emitting diode chip 112 in order to prevent absorption of light therein. A higher difference in index of refraction between the two or more dielectric layers can provide higher reflectivity to the reflector.

The distributed Bragg reflector may be formed by repeatedly stacking, for example, $SiI_2/TiO_2$, $SiO_2/Ta_2O_2$ or $SiO_2/$ HfO. For blue light, the distributed Bragg reflector composed of $SiO_2/TiO_2$ can exhibit good reflection efficiency, and, for UV light, the distributed Bragg reflector composed of $SiO_2/Ta_2O_2$ or $SiO_2/HfO$ can exhibit good reflection efficiency.

Alternatively, the reflector 114 may include an omnidirectional reflector (ODR) as needed.

Alternatively, the reflector 114 may include a plurality of layers including both the distributed Bragg reflector and the omnidirectional reflector as needed. The distributed Bragg reflector exhibits higher reflectivity with respect to light components reaching the reflector at a certain angle or higher approaching a right angle while allowing other light components reaching the reflector at an angle less than the certain angle to pass therethrough.

By way of example, when light is incident at a particular angle on a boundary between two media, a particular polarization component of the light is reflected and other polarization components of the light can be transmitted without reflection. Such a particular angle of incidence is referred to as Brewster's angle. When perpendicularly polarized light and horizontally polarized light enter the boundary at Brewster's angle, the reflection waves and the transmission waves are generated at a right angle with respect to each other and the perpendicularly polarized light is substantially completely reflected. In addition, there can be present an angle at which the horizontally polarized light is substantially completely transmitted without being reflected. As such, the angle at which a coefficient of refraction of the horizontal polarization component becomes 0 (zero) is Brewster's angle. Brewster's angle differs depending upon the properties of a medium. When non-polarized light (for example, light emitted from the active layer) enters the distributed Bragg reflector at Brewster's angle, a perpendicular polarization component of the light is substantially completely reflected and a horizontal polarization component of the light is substantially completely transmitted.

Here, the distributed Bragg reflector may be formed through molecular beam epitaxy, E-beam evaporation, ion-beam assisted deposition, reactive plasma deposition, electron beam evaporation, thermal evaporation, sputtering, or conformal sputtering.

Referring to FIG. 3, the molding part 116 may be disposed to cover the entirety of the light emitting diode chip 112, on which the reflector 114 is disposed. That is, the molding part 116 may be disposed to cover the upper and side surfaces of the light emitting diode chip 112 excluding the n-type electrode and the p-type electrode disposed on the lower side of the light emitting diode chip 112.

The molding part 116 may be formed of a transparent material, for example, silicone, so as to allow light emitted from the light emitting diode chip 112 to pass therethrough.

In this exemplary embodiment, the molding part 116 is formed to cover the light emitting diode chip 112 and may have a size of, for example, 1,500 μm×1,500 μm×420 μm (length×width×thickness). That is, the thickness of the molding part 116 may be larger than or the same as the sum of a thickness t of the light emitting diode chip 112 and a thickness d1 (hereinafter, first thickness) of the molding part 116 from the upper surface of the light emitting diode chip 112 to an upper surface of the molding part 116. Here, the first thickness d1 of the molding part 116 may be smaller than or the same as the thickness t of the light emitting diode chip 112 (d1≤t).

In addition, a width d2 (hereinafter, first width) of the molding part 116 from a side surface of the light emitting diode chip 112 to a side surface of the molding part 116 may be smaller than the first thickness d1. In this exemplary embodiment, the first width d2 may be 1.5 times to 4 times, for example, about 2.44 times the first thickness d1.

In other words, the molding part 116 is formed such that the thickness d1 of the molding part 116 formed on the upper surface of the light emitting diode chip 112 is smaller than the width d2 of the molding part 116 formed on the side surface of the light emitting diode chip 112. Light emitted from the light emitting diode chip 112 is blocked by the reflector disposed on the upper surface of the light emitting diode chip and is mostly emitted in the lateral direction of the light emitting diode chip 112. Furthermore, light emitted from the light emitting diode chip 112 is guided by the shape of the molding part 116 formed on the upper and side surfaces of the light emitting diode chip 112 to be more efficiently discharged in the lateral direction.

As such, since the light emitting diode package 100 including the molding part 116 formed to cover the light emitting diode chip 112 allows light emitted from the light emitting diode chip to be discharged through the side surface thereof rather than the upper surface thereof, the light emitting diode package 100 can be used as a light source for a backlight unit of the display apparatus 200.

Particularly, since the light emitting diode package 100 is configured to allow light to be discharged in the lateral direction thereof, it is possible to omit a lens for diffusing light. Since a separate lens is not used, a plurality of light emitting diode packages 100 may be provided to the frame 210 of the display apparatus 200 in order to replace a backlight unit. In addition, since a separate lens is not used, it is possible to reduce the thickness of the display apparatus 200 more so than if a lens was used.

Further, the molding part 116 may be formed of a transparent material alone, or may further contain at least one kind of phosphor or at least one kind of light diffuser for regulating light diffusion. In this exemplary embodiment, since the optical part 220 includes the phosphor sheet 221 as described above, the molding part 116 can omit a separate phosphor. Alternatively, in order to improve color reproduction of light emitted through the phosphor sheet 221 in the optical part 220, the molding part 116 may contain at least one kind of phosphor.

Figure 4:
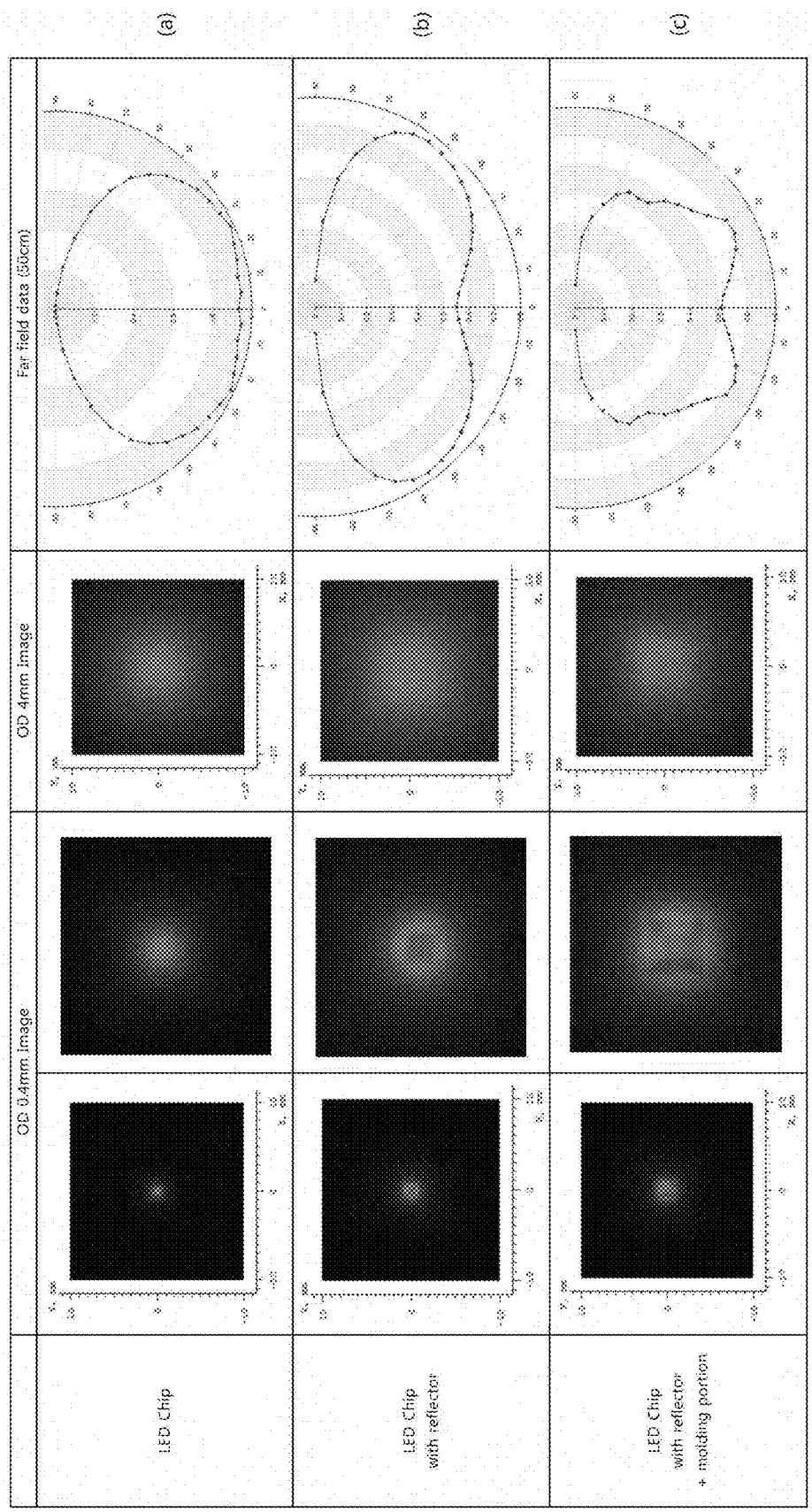
FIG. 4 is a graph comparing light emission from the light emitting diode package according to the first exemplary embodiment.

FIG. 4 is a graph comparing light emission from the light emitting diode package according to the first exemplary embodiment.

FIG. 4 shows images and beam angles of light emitted from the light emitting diode package according to the first exemplary embodiment. First, part (a) of FIG. 4 shows far field data of images of light emitted from the light emitting diode chip 112 and photographed at an OD of 0.4 mm, at an OD of 4 mm and at an OD of 50 cm, respectively. Part (b) of FIG. 4 shows far field data of images of light emitted from the light emitting diode chip 112 with the reflector 114 disposed on the upper side thereof, and photographed at an OD of 0.4 mm, at an OD of 4 mm and at an OD of 50 cm, respectively. Part (c) of FIG. 4 shows far field data of images of light emitted from the light emitting diode chip 112 with the reflector 114 and the molding part 116 disposed thereon, and photographed at an OD of 0.4 mm, at an OD of 4 mm and at an OD of 50 cm, respectively.

It can be confirmed from the images and the far field data that the reflector 114 and the molding part 116 formed on the light emitting diode chip 112 allow uniform spreading of light emitted from the light emitting diode package 100.

Figure 5:
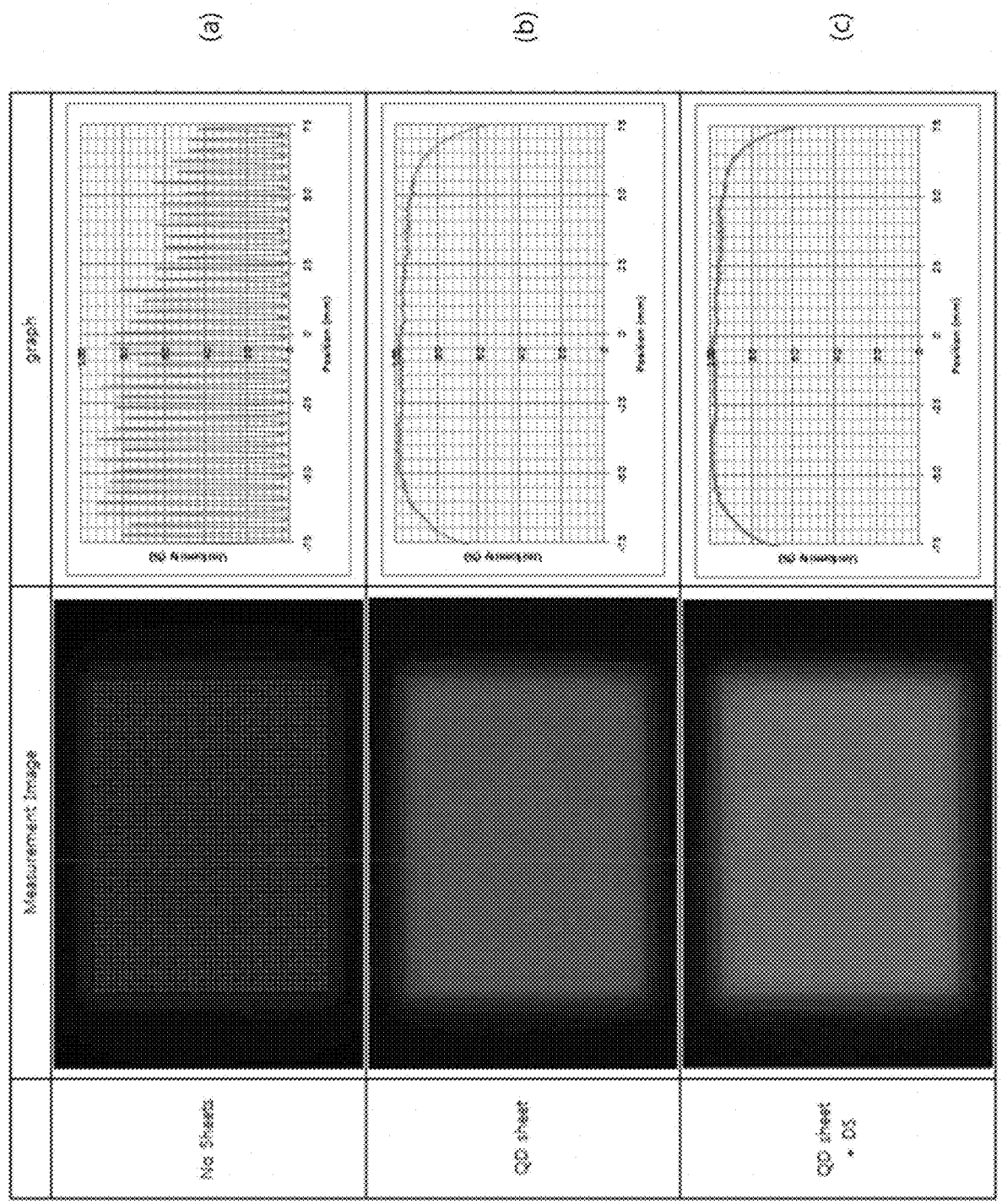
FIG. 5 is a graph depicting uniform light emission from the light emitting diode package according to the first exemplary embodiment.

FIG. 5 is a graph depicting uniform light emission from the light emitting diode package according to the first exemplary embodiment.

Part (a) of FIG. 5 shows an output graph and an image of light emitted from a plurality of light emitting diode packages 100, each of which does not include the phosphor sheet 221 and the optical sheet 225. In part (a) of FIG. 5, it can be seen that light is generally uniformly discharged from the display apparatus 200. A gradual decrease in light output towards the right side of part (a) of FIG. 5 results from a difference in current input to each of the light emitting diode packages 100.

Part (b) of FIG. 5 shows an output graph and an image of light emitted from the plurality of light emitting diode packages 100, with the phosphor sheet 221 disposed above the plurality of light emitting diode packages 100. Comparing the output graph and the image of light shown in part (a) of FIG. 5, it can be seen that light is generally uniformly discharged from the display apparatus 200 even with relatively low output from the light emitting diode packages 100.

Part (c) of FIG. 5 shows an output graph and an image of light emitted from the plurality of light emitting diode packages 100, with the phosphor sheet 221 and the diffusion sheet for diffusion of light disposed above the plurality of light emitting diode packages 100. It can be seen that light can be uniformly discharged through the overall area of the display apparatus when uniformly emitted from the display apparatus 200 in plan view. Particularly, it can be seen from the graph that light was more uniformly discharged from the display apparatus by the diffusion sheet.

Figure 6A:
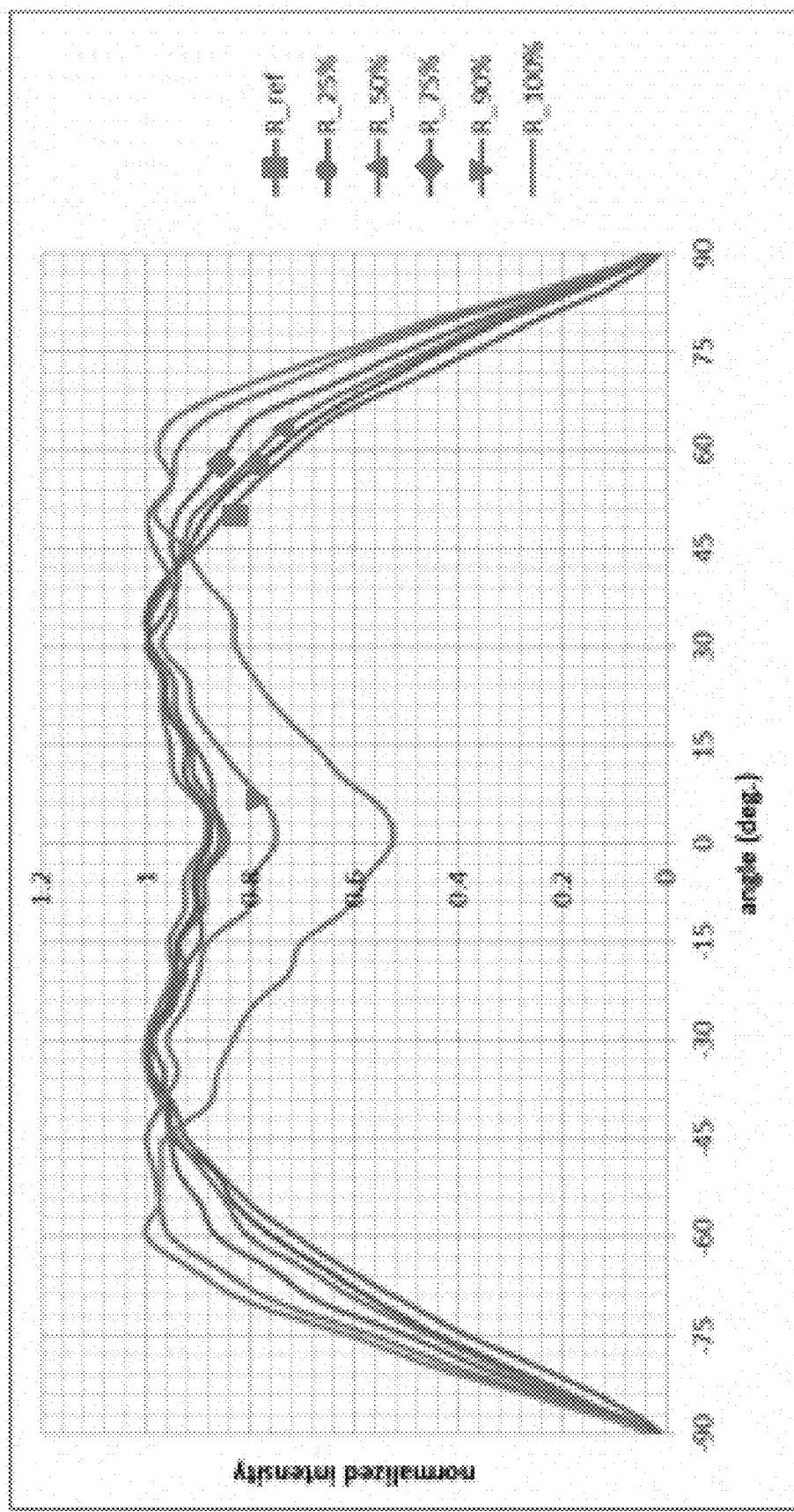
FIG. 6A is a graph depicting directional characteristics of light depending upon reflectivity of a reflector in the light emitting diode package according to the first exemplary embodiment.
Figure 6B:
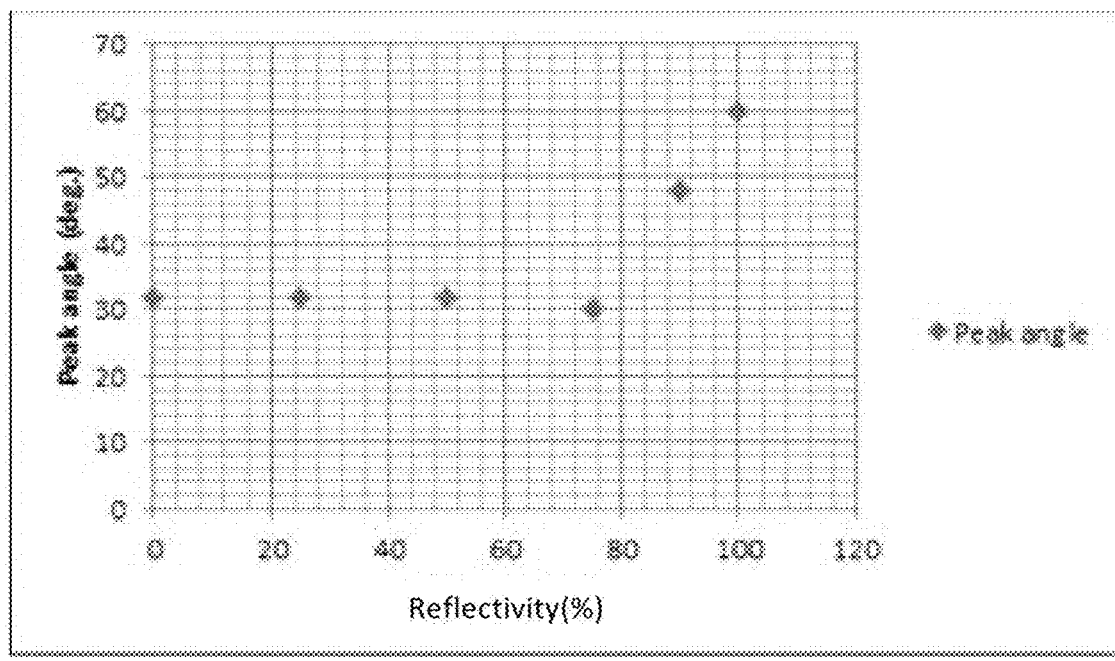
FIG. 6B is a graph depicting peak angles depending upon reflectivity of the reflector in the graph of FIG. 6A.
Figure 6C:
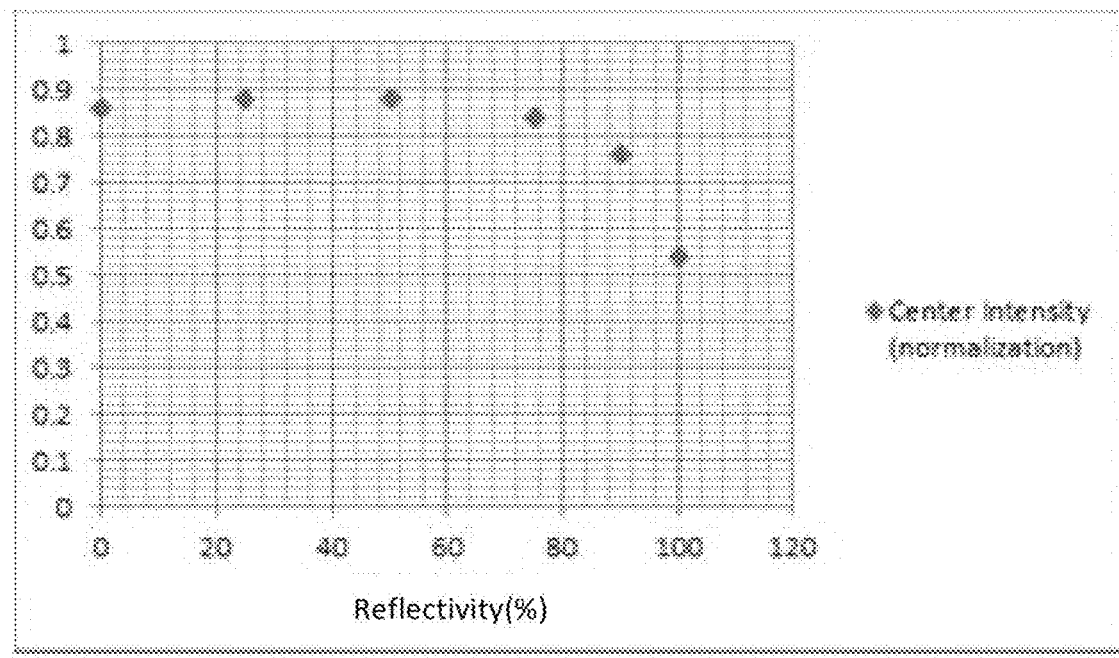
FIG. 6C is a graph depicting center intensity depending upon reflectivity of the reflector in the graph of FIG. 6A.

FIG. 6A, FIG. 6B, and FIG. 6C are graphs depicting directional characteristics of light depending upon reflectivity of a reflector of the light emitting diode package according to the first exemplary embodiment.

FIG. 6A is a graph depicting simulation results of the directional characteristics of light depending upon reflectivity of the reflector 114 in the range of 0% to 100%. For simulation, the light emitting diode package 100 shown in FIG. 3 was used and directional distribution of light at a location of 50 cm was obtained.

As shown in FIG. 6A, it can be seen that the intensity of light at the center of the reflector decreases and the peak angle providing the maximum intensity of light increases as the reflectivity of the reflector 114 increases. That is, it can be confirmed that an angle of a point at which the intensity of light reaches the highest value increases with increasing reflectivity of the reflector. In the graph of FIG. 6A, the x-axis denotes the beam angle of light.

Referring to curves indicating a reflectivity of 90% and a reflectivity of 100% in the graph of FIG. 6A, it can be seen that the intensity of light decreases and the peak angle providing the maximum intensity of light increases at the central angle. Based on this result, an angle improving lateral spreading efficiency of light depending upon reflectivity of the reflector 114 will be described with reference to FIG. 6B and FIG. 6C.

FIG. 6B is a graph depicting peak angles depending upon reflectivity of the reflector 114 at a beam angle of about 60 degrees in FIG. 6A. Referring to FIG. 6B, it can be seen that the peak angle abruptly increases at a point at which the reflectivity of the reflector 114 approaches 75%.

FIG. 6C is a graph depicting peak angles depending upon reflectivity of the reflector 114 at the central angle in FIG. 6A. Referring to FIG. 6C, it can be seen that the peak angle abruptly decreases at a point at which the reflectivity of the reflector 114 reaches 75%.

From FIG. 6B and FIG. 6C, it can be seen that lateral spreading efficiency of the light emitting diode package 100 can be improved using the reflector 114 having a reflectivity of higher than 75%.

Figure 7B:
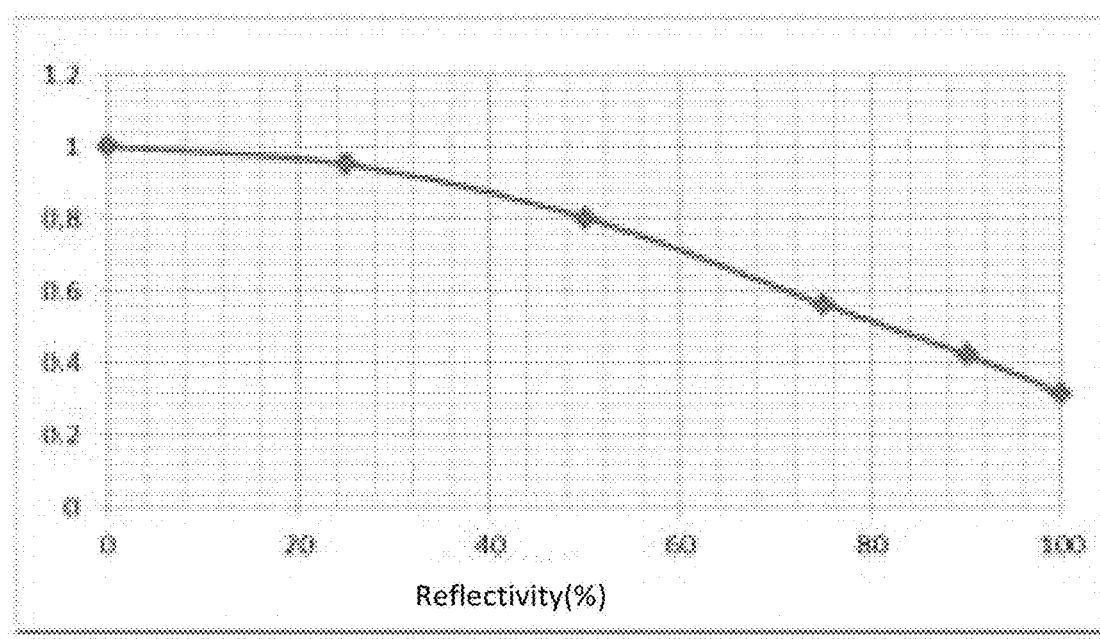
FIG. 7B is a graph depicting central illuminance depending upon reflectivity of the reflector in the light emitting diode package according to the first exemplary embodiment.

FIG. 7A and FIG. 7B are images and a graph for comparing central illuminance depending upon reflectivity of the reflector in the light emitting diode package according to the first exemplary embodiment.

FIG. 7A shows illuminance images of light emitted from the light emitting diode chip 112 without the reflector 114, from the light emitting diode chip 112 with the reflector 114 having a reflectivity of 90%, and from the light emitting diode chip 112 with the reflector 114 having a reflectivity of 100%, in which the OD is commonly set to 2 mm. Referring to FIG. 7A, it can be confirmed that, at an OD of 2 mm, the light emitting diode chip 112 with the reflector 114 having a reflectivity of 90% provides a uniform illuminance image and the light emitting diode chip 112 with the reflector 114 having a reflectivity of 100% provides an illuminance image having a dark spot at the center thereof.

Relative values of the central illuminance of light depending upon reflectivity of the reflector 114 are shown in FIG. 7B. Referring to FIG. 7B, it can be seen that the central illuminance decreases with increasing reflectivity of the reflector 114. It can be seen that, as the central illuminance decreases with increasing reflectivity of the reflector 114, the degree of spreading light in the lateral direction of the light emitting diode package 100 increases.

Figure 8A:
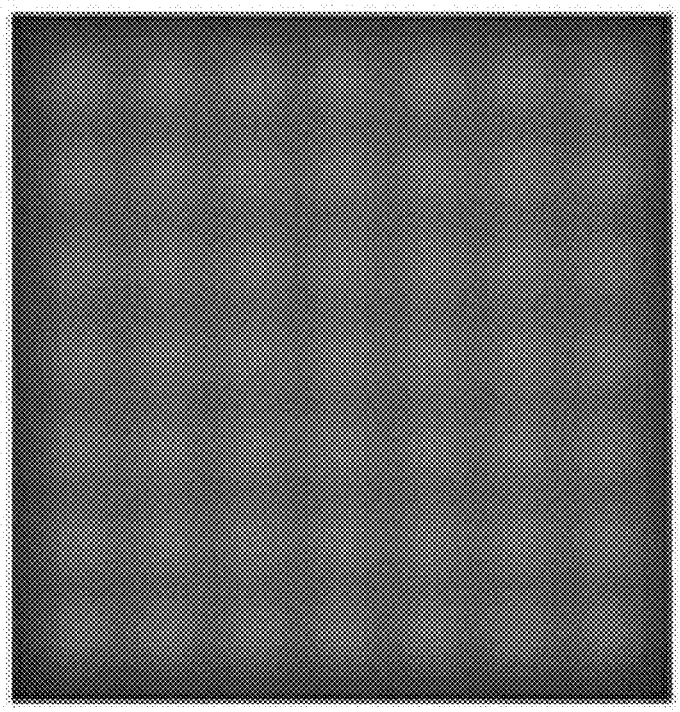
FIG. 8A is an actual image illustrating uniformity of light emitted from the light emitting diode packages according to the first exemplary embodiment, in which light emitting diode chips are disposed alone.
Figure 8B:
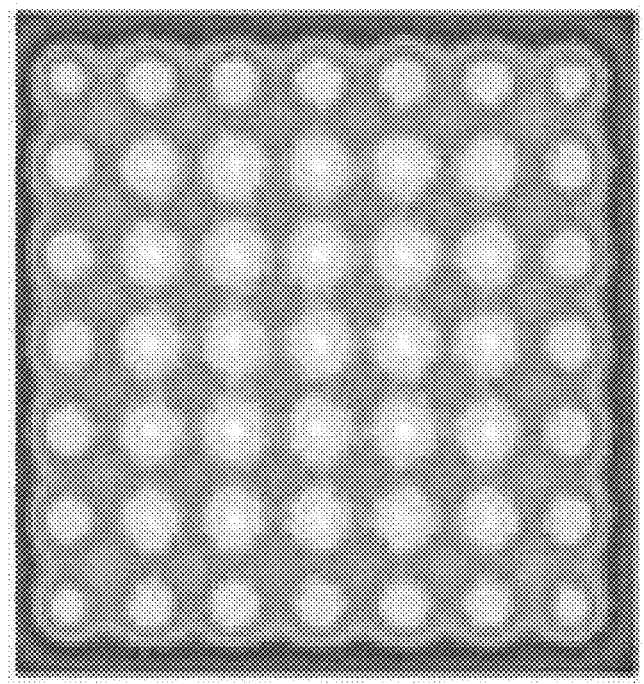
FIG. 8B is a distribution image illustrating uniformity of light emitted from the light emitting diode packages according to the first exemplary embodiment, in which the light emitting diode chips are disposed alone.
Figure 8C:
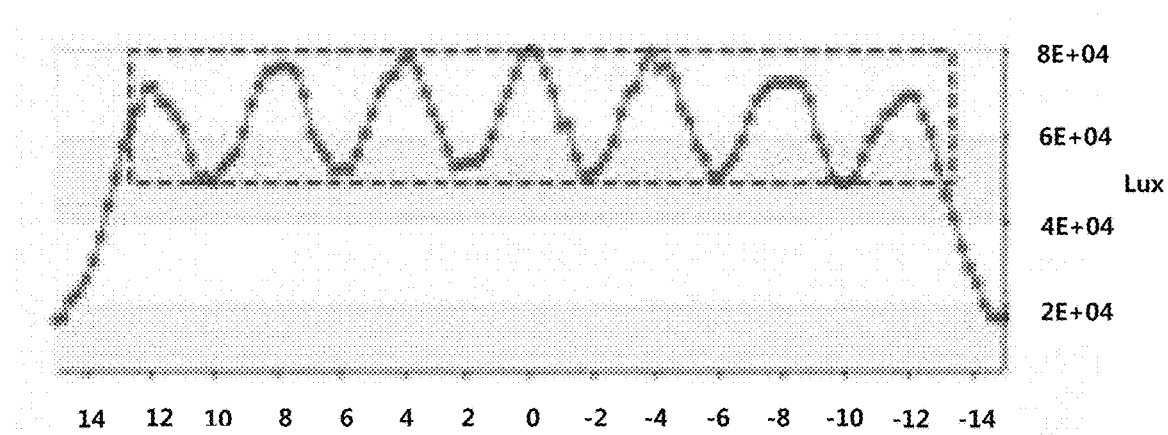
FIG. 8C is a graph illustrating uniformity of light emitted from the light emitting diode packages according to the first exemplary embodiment, in which the light emitting diode chips are disposed alone.
Figure 9A:
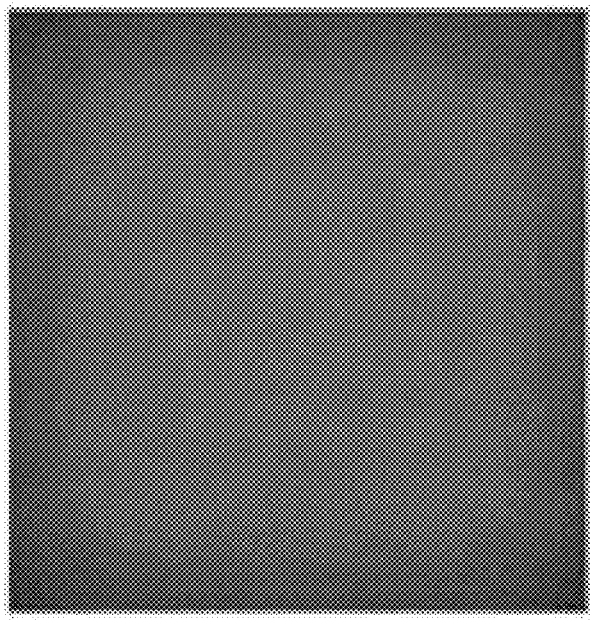
FIG. 9A is an actual image illustrating uniformity of light emitted from the light emitting diode packages according to the first exemplary embodiment.
Figure 9B:
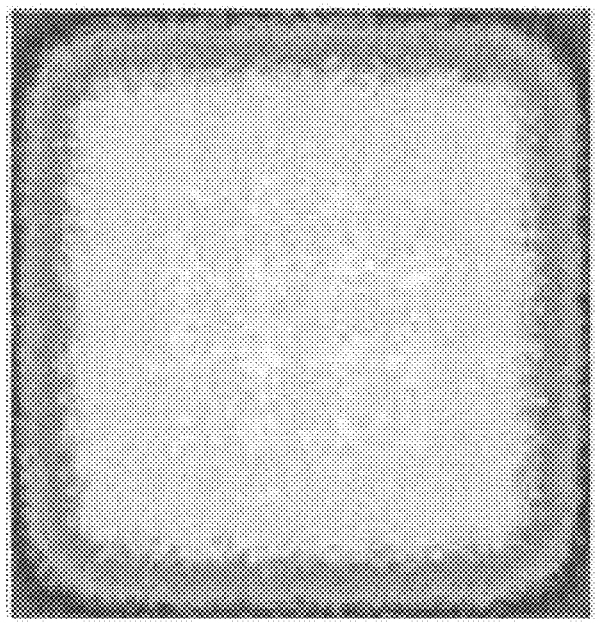
FIG. 9B is a distribution image illustrating uniformity of light emitted from the light emitting diode packages according to the first exemplary embodiment.
Figure 9C:
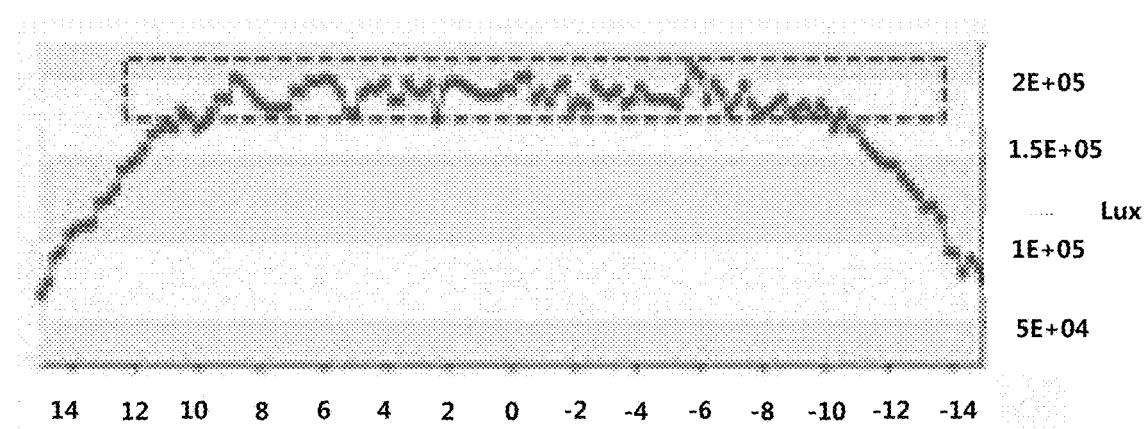
FIG. 9C is a graph illustrating uniformity of light emitted from the light emitting diode packages according to the first exemplary embodiment.

FIG. 8A, FIG. 8B, and FIG. 8C are images illustrating uniformity of light emitted from the light emitting diode packages according to the first exemplary embodiment, in which the light emitting diode chips are disposed alone. FIG. 9A, FIG. 9B, and FIG. 9C are images illustrating uniformity of light emitted from the light emitting diode packages according to the first exemplary embodiment.

FIG. 8A and FIG. 8B are an actual image and a distribution image of light emitted from light emitting diode packages, in which the light emitting diode chips 112 are arranged without the reflector 114 and the molding part 116, and FIG. 8C is a graph for confirmation of uniformity of arrangement of the light emitting diode chips 112.

From the images of FIG. 8A and FIG. 8B, it can be confirmed that light emitted from the light emitting diode chips 112 exhibits relatively poor uniformity to a degree of enabling confirmation of a location of each of the light emitting diode chips 112 and the number of light emitting diode chips 112.

From the graph of FIG. 8C, it can be confirmed that the highest illuminance and the lowest illuminance of the light emitting diode chips 112 are about 8,000 lux and about 4,600 lux, respectively, and that the light emitted from the light emitting diode chips has a degree of uniformity of about 57.5% based on these illuminance values.

On the other hand, FIG. 9A and FIG. 9B are an actual image and a distribution image of light emitted from light emitting diode packages 100 arranged in FIG. 8A, in which the reflector 114 and the molding part 116 are disposed on each of the light emitting diode chips 112. FIG. 9C is a graph for confirmation of uniformity of arrangement of the light emitting diode packages 100.

Comparing with the images of FIG. 8A and FIG. 8B, it can be confirmed that light is uniformly distributed on an upper surface of the display apparatus. In addition, from the graph of FIG. 9C, it can be confirmed that the highest illuminance and the lowest illuminance of the light emitting diode packages 100 are about 210,000 lux and about 175,000 lux, respectively, and that the light emitted from the light emitting diode packages has a degree of uniformity of about 83.3% based on these illuminance values.

Comparing the images of FIG. 9C with the image of FIG. 8C, it can be confirmed that light uniformity of the light emitting diode package 100 further including the reflector 114 and the molding part 116 is increased by about 25% or more compared to the light emitting diode package 100 including the light emitting diode chip 112 alone.

Figure 10:
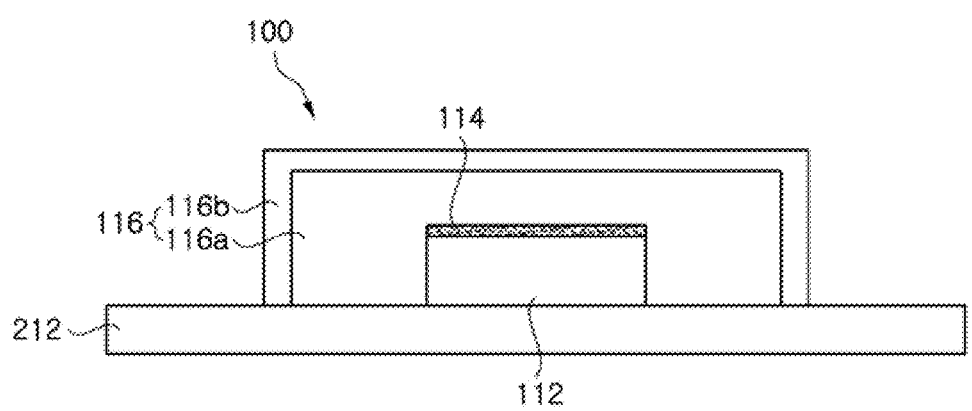
FIG. 10 is a sectional view of a light emitting package of a display apparatus according to a second exemplary embodiment.

FIG. 10 is a sectional view of a light emitting diode package of a display apparatus according to a second exemplary embodiment.

The display apparatus 200 according to the second exemplary embodiment is the same as the display apparatus according to the first exemplary embodiment except for the light emitting diode package 100 and different features of the light emitting diode package 100 according to the second exemplary embodiment will be described with reference to FIG. 10. In description of the second exemplary embodiment, descriptions of the same components as those of the first exemplary embodiment will be omitted. In this exemplary embodiment, the light emitting diode package 100 includes a light emitting diode chip 112 disposed on a substrate 212, a reflector 114, and a molding part 116.

The light emitting diode chip 112 and the reflector 114 of the light emitting diode package 100 according to the second exemplary embodiment are the same as those of the light emitting diode package 100 according to the first exemplary embodiment and descriptions thereof will be omitted. In the light emitting diode package 100 according to the second exemplary embodiment, the molding part 116 includes a first molding portion 116a and a second molding portion 116b.

As shown in FIG. 10, the first molding portion 116a may be disposed to cover the entirety of the light emitting diode chip 112, on which the reflector 114 is disposed. The first molding portion 116a may be disposed to cover the upper and side surfaces of the light emitting diode chip 112 excluding the n-type electrode and the p-type electrode disposed on a lower side of the light emitting diode chip 112.

The second molding portion 116b is disposed to cover the entirety of the first molding portion 116a. Like the first molding portion 116a, the second molding portion 116b may be disposed to cover upper and side surfaces of the first molding portion 116a excluding the lower side of the light emitting diode chip 112. The second molding portion 116b may have the same thickness as or a different thickness than the first molding portion 116a. The second molding portion 116b may have a smaller thickness than the first molding portion 116a.

Each of the first molding portion 116a and the second molding portion 116b may be formed of a transparent material such that light emitted from the light emitting diode chip 112 can be transmitted therethrough.

In this exemplary embodiment, the first molding portion 116a and the second molding portion 116b may have different indexes of refraction. In order to reduce reflection due to a difference in media when light emitted from the light emitting diode chip 112 is discharged to the outside, the second molding portion 116b may have a smaller index of refraction than the first molding portion 116a, without being limited thereto. Alternatively, the index of refraction of the first molding portion 116a may be greater than or equal to that of the second molding portion 116b.

In addition, the first molding portion 116a and the second molding portion 116b may be formed of materials having different rigidities. When manufacturing using materials having different rigidities, cracks can be generated on an outer surface of the materials. Thus, in order to prevent the generation of cracks on an outer surface of the first molding portion 116a formed of a soft material, the second molding portion 116b having higher rigidity than the first molding portion 116a is formed on the outer surface of the first molding portion 116a.

Figure 11:
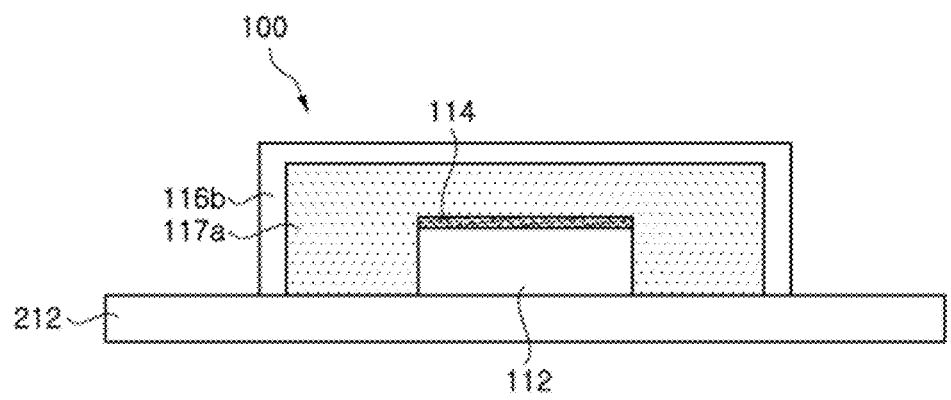
FIG. 11 is a sectional view of a light emitting package of a display apparatus according to a third exemplary embodiment.

FIG. 11 is a sectional view of a light emitting diode package of a display apparatus according to a third exemplary embodiment.

The display apparatus 200 according to the third exemplary embodiment is the same as the display apparatus according to the first exemplary embodiment except for the light emitting diode package 100 and different features of the light emitting diode package 100 according to the third exemplary embodiment will be described with reference to FIG. 11. In description of the third exemplary embodiment, descriptions of the same components as those of the first exemplary embodiment will be omitted. In this exemplary embodiment, the light emitting diode package 100 includes a light emitting diode chip 112 disposed on a substrate 212, a reflector 114, a molding part 116, and a wavelength conversion part 117.

The light emitting diode chip 112, the reflector 114 and the molding part 116 of the light emitting diode package 100 according to the third exemplary embodiment are the same as those of the light emitting diode package 100 according to the first exemplary embodiment and descriptions thereof will be omitted.

As shown in FIG. 11, the wavelength conversion part 117 may be disposed to cover the entirety of the light emitting diode chip 112, on which the reflector 114 is disposed. The wavelength conversion part 117 may be disposed to cover the upper and side surfaces of the light emitting diode chip 112 excluding the n-type electrode and the p-type electrode disposed on the lower side of the light emitting diode chip 112.

The wavelength conversion part 117 may contain at least one kind of phosphor. As a result, the wavelength conversion part 117 can emit light having a different wavelength than light emitted from the light emitting diode chip 112 through wavelength conversion of the light emitted from the light emitting diode chip 112.

The molding part 116 may be disposed to cover the entirety of the wavelength conversion part 117. Like the wavelength conversion part 117, the molding part 116 may be disposed to cover the upper and side surfaces of the wavelength conversion part 117 excluding the lower side of the light emitting diode chip 112. The molding part 116 may have the same thickness as or a different thickness than the wavelength conversion part 117. The molding part 116 may have a smaller thickness than the wavelength conversion part 117.

The wavelength conversion part 117 may contain at least one kind of phosphor and may be formed of the same material as the molding part 116 or may be formed of a different transparent material than the molding part 116. That is, light emitted from the light emitting diode chip 112 may be subjected to wavelength conversion through the wavelength conversion part 117 and be discharged through the molding part 116.

As such, with the wavelength conversion part 117 disposed to adjoin the light emitting diode chip 112, wavelength conversion of light emitted from the light emitting diode chip 112 into light having a different wavelength can be easily achieved, thereby allowing easy control of colors emitted from the light emitting diode package 100.

In addition, with the wavelength conversion part 117 disposed adjacent to the light emitting diode chip 112, efficiency in wavelength conversion of light emitted from the light emitting diode chip 112 is increased, thereby improving light extraction efficiency of the light emitting diode package 100.

Figure 12:
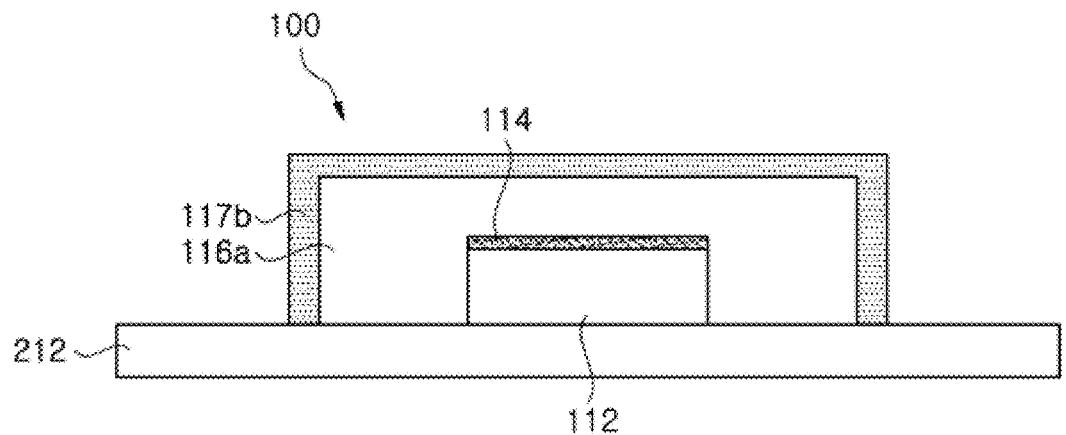
FIG. 12 is a sectional view of a light emitting package of a display apparatus according to a fourth exemplary embodiment.

FIG. 12 is a sectional view of a light emitting diode package of a display apparatus according to a fourth exemplary embodiment.

The display apparatus 200 according to the fourth exemplary embodiment is the same as the display apparatus according to the first exemplary embodiment except for the light emitting diode package 100. Thus, the light emitting diode package 100 according to the fourth exemplary embodiment will be described with reference to FIG. 12 and descriptions of the same components as those of the first exemplary embodiment will be omitted. In this exemplary embodiment, the light emitting diode package 100 includes a light emitting diode chip 112 disposed on a substrate 212, a reflector 114, a molding part 116, and a wavelength conversion part 117.

The light emitting diode chip 112 and the reflector 114 of the light emitting diode package 100 according to the fourth exemplary embodiment are the same as those of the light emitting diode package 100 according to the first exemplary embodiment and descriptions thereof will be omitted.

As shown in FIG. 12, the wavelength conversion part 117 is disposed to cover the entirety of the molding part 116. Like the molding part 116, the wavelength conversion part 117 may be disposed to cover the upper and side surfaces of the molding part 116 excluding the lower side of the light emitting diode chip 112. The wavelength conversion part 117 may have the same thickness as or a different thickness than the first molding portion 116a. The wavelength conversion part 117 may have a smaller thickness than the molding part 116.

The wavelength conversion part 117 may be formed of the same material as the molding part 116 or may be formed of a different transparent material than the molding part 116. In addition, the wavelength conversion part 117 may contain at least one kind of phosphor. As a result, the wavelength conversion part 117 can emit light having a different wavelength than light emitted from the light emitting diode chip 112 through wavelength conversion of the light emitted from the light emitting diode chip 112.

In this exemplary embodiment, with the wavelength conversion part 117 disposed outside the molding part 116, wavelength conversion of light emitted from the light emitting diode chip 112 into light having a different wavelength can be easily achieved, thereby allowing easy control of colors emitted from the light emitting diode package 100.

In this exemplary embodiment, with the molding part 116 disposed between the wavelength conversion part 117 and the light emitting diode chip 112, the wavelength conversion part 117 does not directly contact the light emitting diode chip 112. Accordingly, heat discharged from the light emitting diode chip 112 is not directly transferred to the wavelength conversion part 117, thereby minimizing deterioration of the phosphors in the wavelength conversion part 117 due to heat discharged from the light emitting diode chip 112

Figure 13:
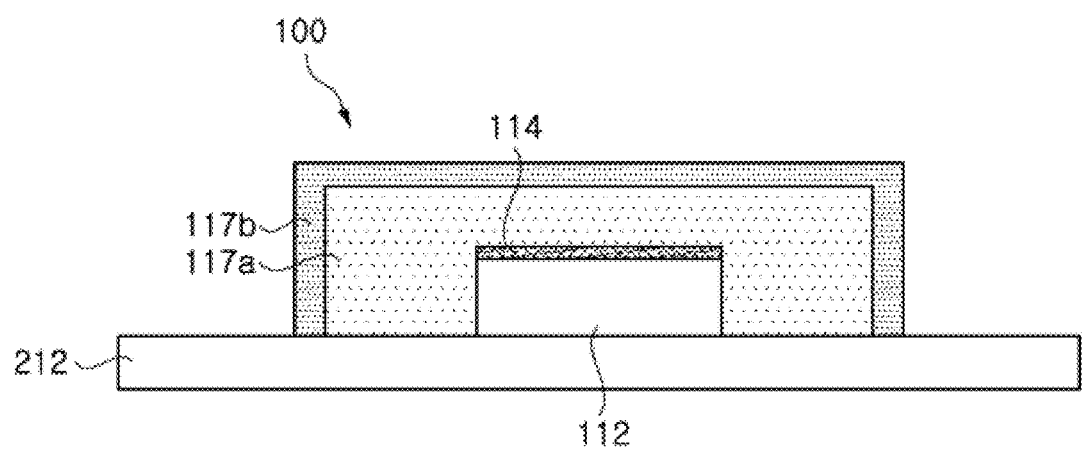
FIG. 13 is a sectional view of a light emitting package of a display apparatus according to a fifth exemplary embodiment.

FIG. 13 is a sectional view of a light emitting diode package of a display apparatus according to a fifth exemplary embodiment.

The display apparatus 200 according to the fifth exemplary embodiment is the same as the display apparatus according to the first exemplary embodiment except for the light emitting diode package 100. Thus, the light emitting diode package 100 according to the fifth exemplary embodiment will be described with reference to FIG. 13 and descriptions of the same components as those of the first exemplary embodiment will be omitted. In this exemplary embodiment, the light emitting diode package 100 includes a light emitting diode chip 112 disposed on a substrate 212, a reflector 114, and a wavelength conversion part 117.

The light emitting diode chip 112 and the reflector 114 of the light emitting diode package 100 according to the fifth exemplary embodiment are the same as those of the light emitting diode package 100 according to the first exemplary embodiment and descriptions thereof will be omitted.

Referring to FIG. 13, the wavelength conversion part 117 includes a first wavelength conversion portion 117a and a second wavelength conversion portion 117b.

The first wavelength conversion portion 117a may be disposed to cover the entirety of the light emitting diode chip 112, on which the reflector 114 is disposed. The first wavelength conversion portion 117a may be disposed to cover the upper and side surfaces of the light emitting diode chip 112 excluding the n-type electrode and the p-type electrode disposed on the lower side of the light emitting diode chip 112. The first wavelength conversion portion 117a may contain at least one kind of phosphor therein.

The second wavelength conversion portion 117b may be disposed to cover the entirety of the first wavelength conversion portion 117a. Like the first wavelength conversion portion 117a, the second wavelength conversion portion 117b may be disposed to cover the upper and side surfaces of the first wavelength conversion portion 117a excluding the lower side of the light emitting diode chip 112. The second wavelength conversion portion 117b may have the same thickness as or a different thickness than the first wavelength conversion portion 117a. The second wavelength conversion portion 117b may have a smaller thickness than the first wavelength conversion portion 117a. The second wavelength conversion portion 117b may contain at least one kind of phosphor.

The phosphor contained in the first wavelength conversion portion 117a may be the same kind as or different kind than the phosphor contained in the second wavelength conversion portion 117b. In addition, when the first wavelength conversion portion 117a and the second wavelength conversion portion 117b contain the same kind of phosphor, the first wavelength conversion portion 117a may contain a different amount of phosphor than the second wavelength conversion portion 117b. As a result, light emitted from the light emitting diode chip 112 is subjected to wavelength conversion through the first wavelength conversion portion 117a and the second wavelength conversion portion 117b and is then discharged to the outside. With the first and second wavelength conversion portions 117a, 117b disposed on the light emitting diode chip 112, it is possible to achieve easy control of light emitted from the light emitting diode package 100.

Figure 14:
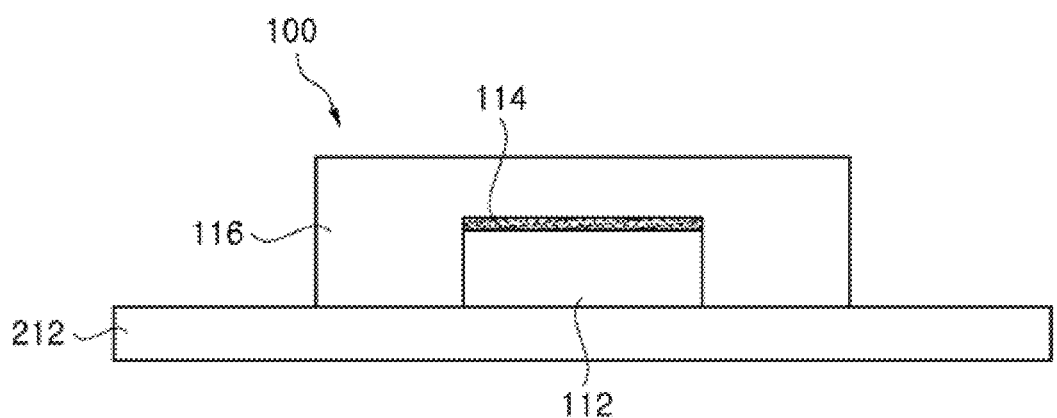
FIG. 14 is a sectional view of a light emitting package of a display apparatus according to a sixth exemplary embodiment.
Figure 15:
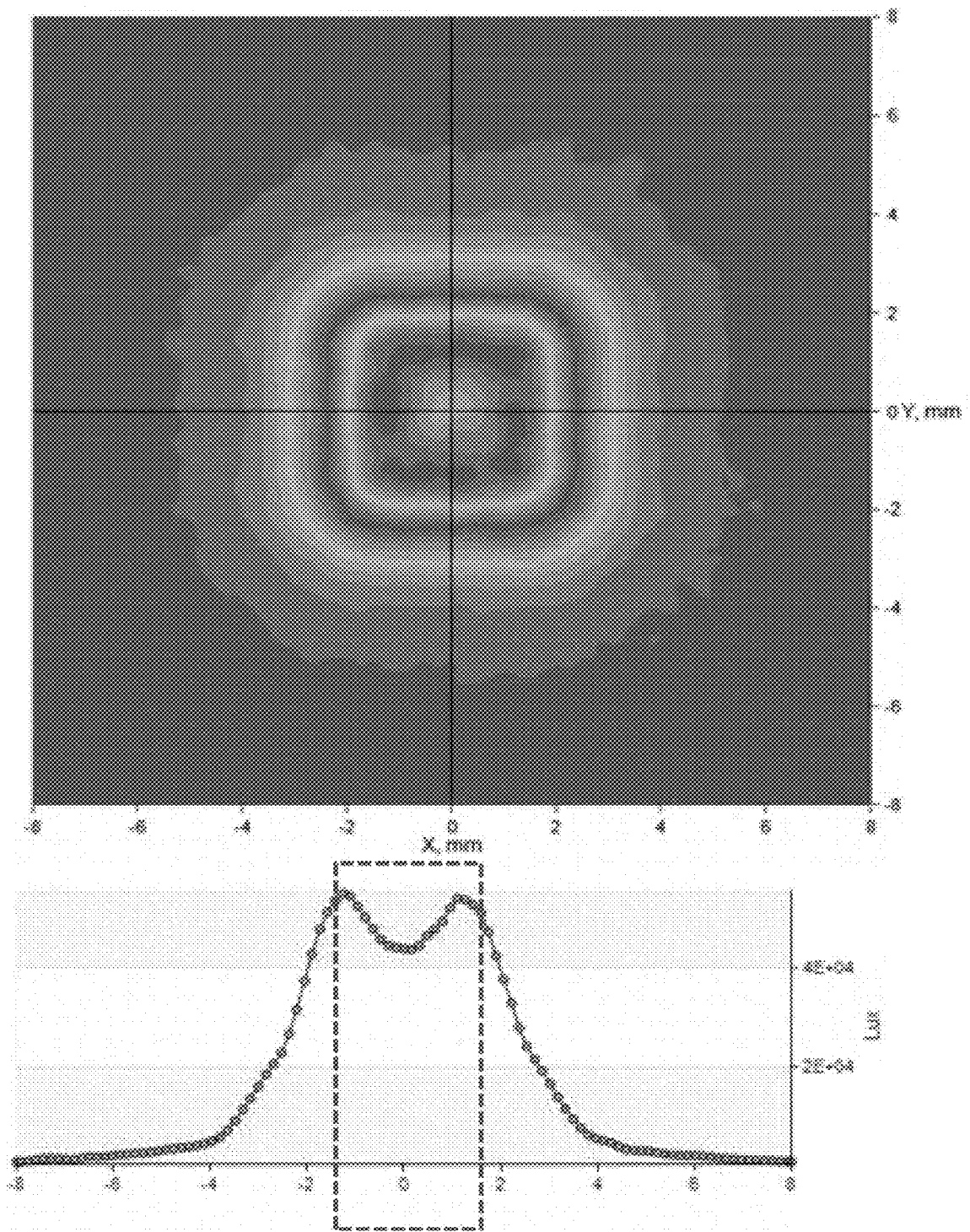
FIG. 15 shows an image and a graph depicting central light distribution of the light emitting diode package according to the sixth exemplary embodiment.

FIG. 14 is a sectional view of a light emitting package of a display apparatus according to a sixth exemplary embodiment and FIG. 15 shows an image and a graph depicting central light distribution of the light emitting diode package according to the sixth exemplary embodiment.

The display apparatus 200 according to the sixth exemplary embodiment is the same as the display apparatus according to the first exemplary embodiment except for the light emitting diode package 100. Thus, the light emitting diode package 100 according to the sixth exemplary embodiment will be described with reference to FIG. 14 and descriptions of the same components as those of the first exemplary embodiment will be omitted.

In this exemplary embodiment, the light emitting diode package 100 includes a light emitting diode chip 112 disposed on a substrate 212, a reflector 114, and a molding part 116. Referring to FIG. 14, although the light emitting diode package 100 according to this exemplary embodiment has the same shape as the light emitting diode package according to the first exemplary embodiment shown in FIG. 3, the reflector 114 of the light emitting diode package 100 according to this embodiment employs a distributed Bragg reflector having a reflectivity of 100%. In addition, the reflector 114 may be disposed to cover the entirety of the upper surface of the light emitting diode chip 112.

With this structure, the light emitting diode package 100 according to this exemplary embodiment may have a central light distribution as shown in FIG. 15. The central light distribution shown in FIG. 15 is an image at an OD of 1 mm. In an illuminance graph shown at a lower side of FIG. 15, it can be seen that the light emitting diode package has a lower light distribution at the center thereof than in a surrounding region thereof. This result shows that light emitted from the light emitting diode package 100 is efficiently spread in the lateral direction.

In addition, considering that the central light distribution shown in FIG. 15 is an image at an OD of 1 mm, the light emitting diode package 100 exhibits better light spreading efficiency in the lateral direction at an OD of less than 1 mm and thus can employ a distributed Bragg reflector having a reflectivity of 100% on the upper surface of the light emitting diode chip 112.

Figure 16:
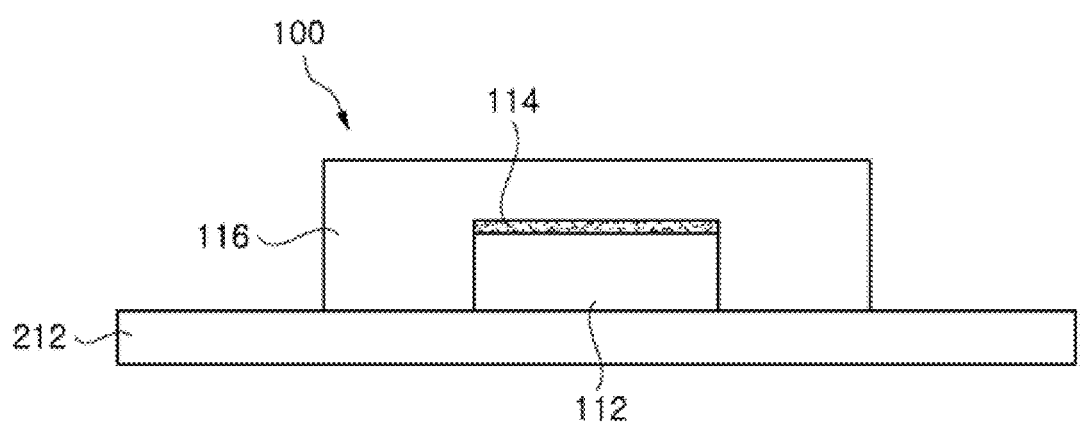
FIG. 16 is a sectional view of a light emitting package of a display apparatus according to a seventh exemplary embodiment.
Figure 17:
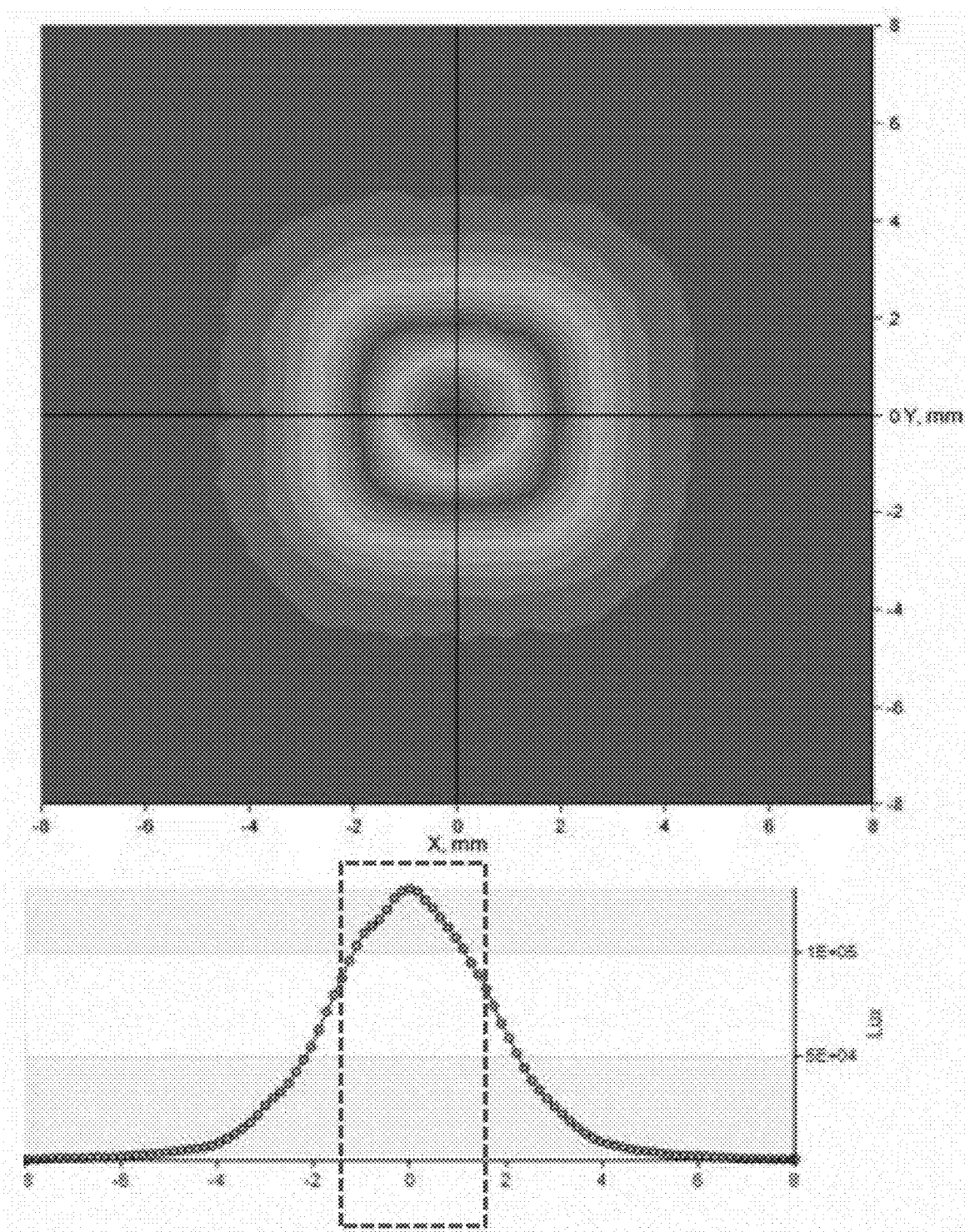
FIG. 17 shows an image and a graph depicting central light distribution of the light emitting diode package according to the seventh exemplary embodiment.

FIG. 16 is a sectional view of a light emitting package of a display apparatus according to a seventh exemplary embodiment and FIG. 17 shows an image and a graph depicting central light distribution of the light emitting diode package according to the seventh exemplary embodiment.

The display apparatus 200 according to the seventh exemplary embodiment is the same as the display apparatus according to the first exemplary embodiment except for the light emitting diode package 100. Thus, the light emitting diode package 100 according to the seventh exemplary embodiment will be described with reference to FIG. 16 and descriptions of the same components as those of the first exemplary embodiment will be omitted.

In this exemplary embodiment, the light emitting diode package 100 includes a light emitting diode chip 112 disposed on a substrate 212, a reflector 114, and a molding part 116. Referring to FIG. 16, although the light emitting diode package 100 according to this exemplary embodiment has the same shape as the light emitting diode package according to the first exemplary embodiment shown in FIG. 3, the reflector 114 of the light emitting diode package 100 according to this embodiment employs a distributed Bragg reflector having a reflectivity of 25%. In addition, the reflector 114 may be disposed to cover the entirety of the upper surface of the light emitting diode chip 112.

The image and graph of the central light distribution of the light emitting diode package 100 shown in FIG. 17 are obtained at an OD of 1 mm. From the image and the graph shown in FIG. 17, it can be seen that the light emitting diode package 100 has a higher light distribution at the center thereof than in a surrounding region thereof. Accordingly, the light emitting diode package 100 according to this exemplary embodiment can be advantageously used at an OD of larger than 1 mm.

Figure 18A:
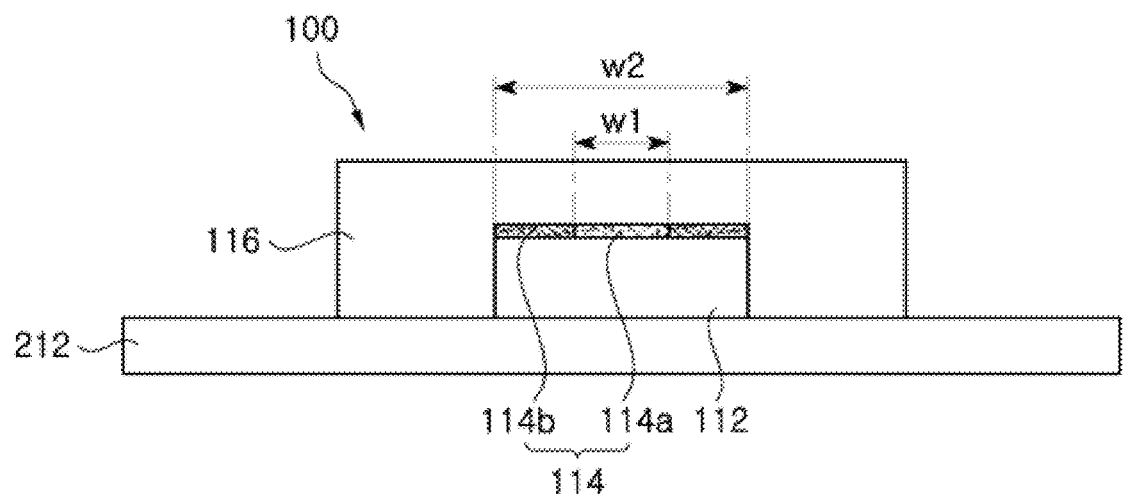
FIG. 18A is a sectional view of a light emitting package of a display apparatus according to an eighth exemplary embodiment.
Figure 18B:
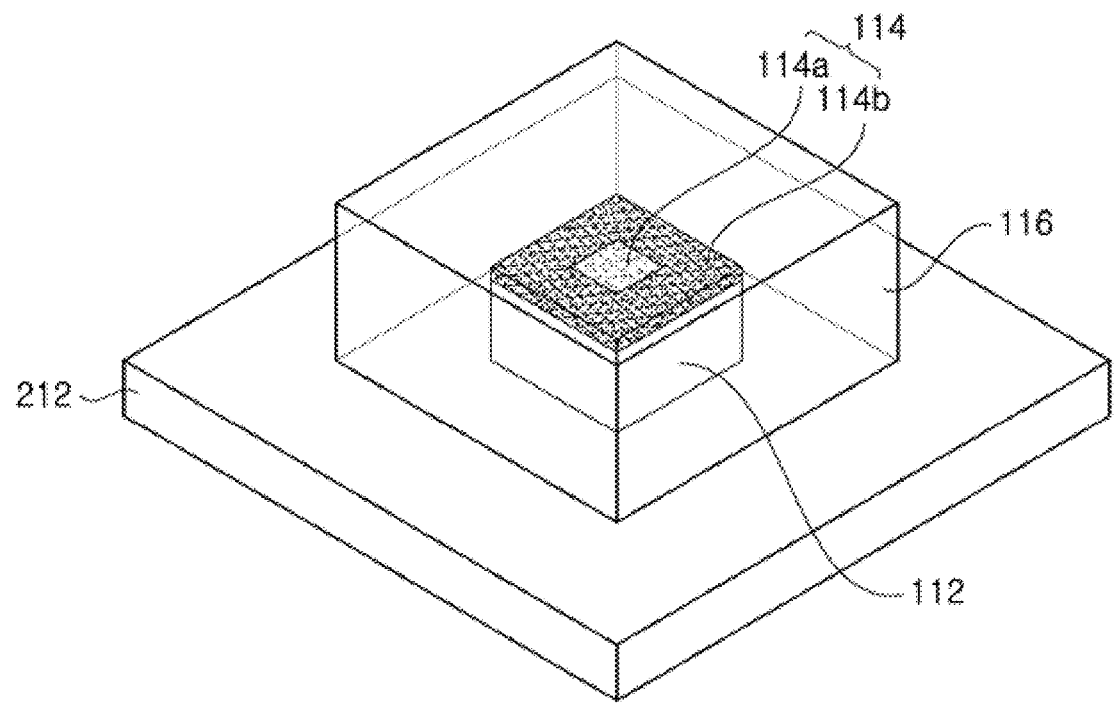
FIG. 18B is a perspective view of the light emitting diode package according to the eighth exemplary embodiment.
Figure 19:
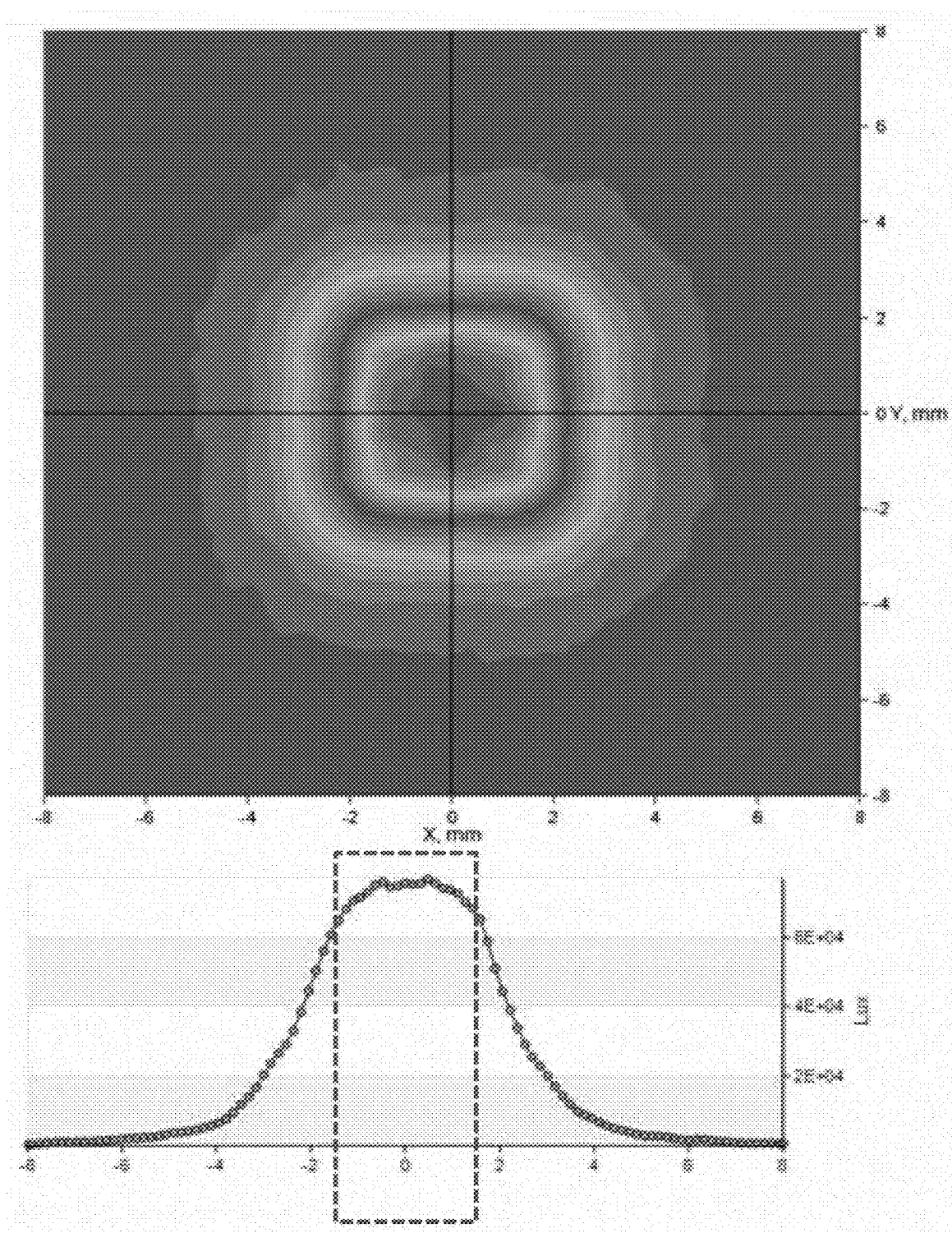
FIG. 19 shows an image and a graph depicting central light distribution of the light emitting diode package according to the eighth exemplary embodiment.

FIG. 18A and FIG. 18B are a sectional view and a perspective view of a light emitting package of a display apparatus according to an eighth exemplary embodiment, respectively, and FIG. 19 shows an image and a graph depicting central light distribution of the light emitting diode package according to the eighth exemplary embodiment.

Referring to FIG. 18A and FIG. 18B, the light emitting diode package 100 according to this exemplary embodiment includes a light emitting diode chip 112, a reflector 114, and a molding part 116. Other components of the display apparatus 200 according to this exemplary embodiment are the same as those of the display apparatus according to the first exemplary embodiment and descriptions thereof will be omitted.

In this exemplary embodiment, the reflector 114 includes a first reflector 114a and a second reflector 114b. As shown in FIG. 18A and FIG. 18B, the first reflector 114a and the second reflector 114b are disposed on the upper surface of the light emitting diode chip 112 to be coplanar with each other. The first reflector 114a is disposed at the center of the light emitting diode chip 112 and the second reflector 114b is disposed to surround the first reflector 114a. With this structure, the first reflector 114a may be disposed inside the second reflector 114b, as shown in FIG. 18B.

In this exemplary embodiment, referring to FIG. 18A, the first reflector 114a may have a width w1 that is about 30% to 45% of a width w2 of the second reflector 114b. With this width w1, the first reflector 114a can be disposed at the center of the upper surface of the light emitting diode chip 112 and can reflect a fraction of light emitted from the light emitting diode chip 112 while allowing transmission of other fractions of the light depending upon reflectivity of the first reflector 114a.

In this exemplary embodiment, the first reflector 114a may have different reflectivity than the second reflector 114b. The first reflector 114a may have a lower reflectivity than the second reflector 114b.

In this exemplary embodiment, since the light emitting diode package 100 is used as a backlight unit of the display apparatus 200 and the second reflector 114b has a higher reflectivity than the first reflector 114a, the light emitting diode package 100 can exhibit high light spreading efficiency in the lateral direction and high light exiting efficiency at the center of the light emitting diode chip 112.

Simulation results of these effects are shown in FIG. 19. The image at an upper side of FIG. 19 shows a distribution of light emitted from the light emitting diode package 100 according to this exemplary embodiment and the graph at a lower side thereof is an illuminance graph.

The simulation results shown in FIG. 19 are obtained at an OD of 1 mm under conditions that the first reflector 114a has a reflectivity of 25% and the second reflector 114b has a reflectivity of 100%. As a result, it can be confirmed that the first reflector 114a and the second reflector 114b disposed on the light emitting diode package 100 according to this exemplary embodiment allow light emitted from the light emitting diode package 100 to be more uniformly discharged both through the center and the side thereof.

This exemplary embodiment is not limited to the simulation results obtained by setting the reflectivity of each of the first reflector 114a and the second reflector 114b to the value as mentioned above, and the reflectivity of each of the first reflector 114a and the second reflector 114b can be changed as needed. That is, in order to allow light emitted from the light emitting diode package 100 to be uniformly discharged to the outside, the reflectivity of each of the first reflector 114a and the second reflector 114b can be changed.

In addition, in order to allow light to be discharged to the outside from the display apparatus 200 with the light emitting diode package 100 disposed therein, not only the reflectivity of each of the first reflector 114a and the second reflector 114b, but also the widths w1, w2 of the first reflector 114a and the second reflector 114b can also be changed.

Figure 20:
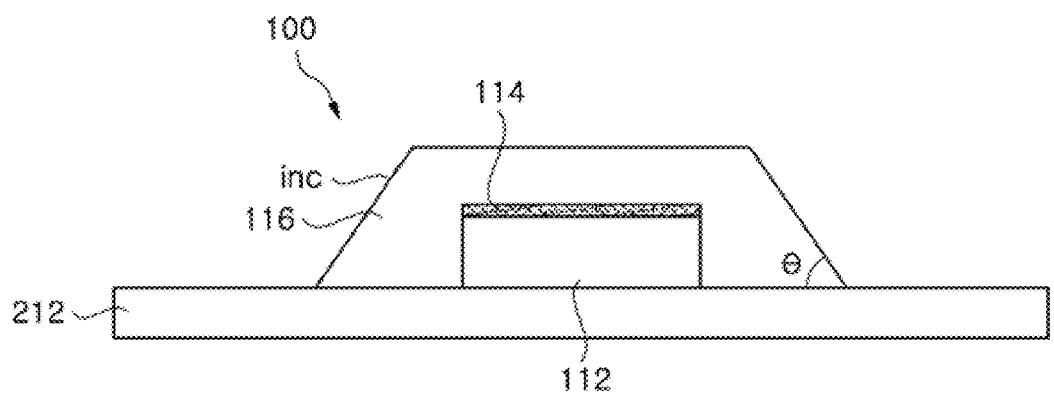
FIG. 20 is a sectional view of a light emitting package of a display apparatus according to a ninth exemplary embodiment.
Figure 21:
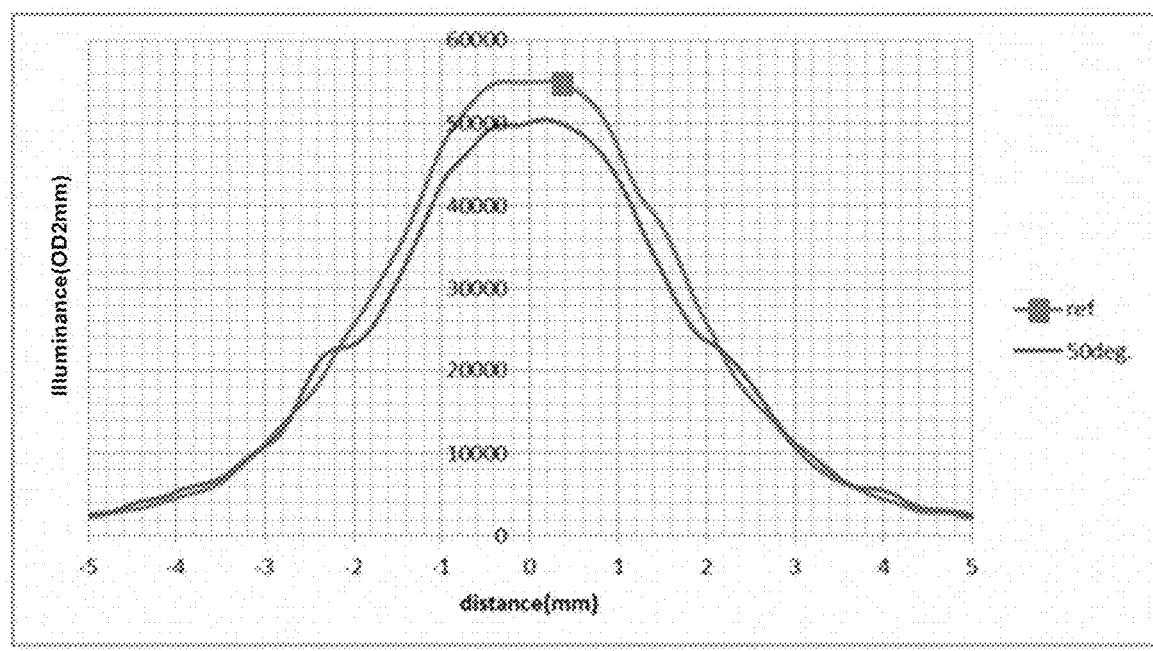
FIG. 21 shows an image and a graph depicting illuminance of the light emitting diode package according to the ninth exemplary embodiment.

FIG. 20 is a sectional view of a light emitting package of a display apparatus according to a ninth exemplary embodiment and FIG. 21 shows an image and a graph depicting illuminance of the light emitting diode package according to the ninth exemplary embodiment.

Referring to FIG. 20, the light emitting diode package 100 according to this exemplary embodiment includes a light emitting diode chip 112 disposed on a substrate 212, a reflector 114, and a molding part 116. Other components of the display apparatus 200 according to this exemplary embodiment are the same as those of the display apparatus according to the first exemplary embodiment and descriptions thereof will be omitted.

In the light emitting diode package 100 according to this exemplary embodiment, the reflector 114 is disposed on the light emitting diode chip 112 and the molding part 116 is disposed to cover the light emitting diode chip 112 and the reflector 114. The molding part 116 is disposed to cover the upper and side surfaces of the light emitting diode chip 112 and the reflector 114 excluding the n-type electrode and the p-type electrode disposed on the lower side of the light emitting diode chip 112.

The molding part 116 may have an inclined side surface (inc). The inclined side surface (inc) of the molding part 116 may extends downwards from an upper surface of the molding part 116. All of the side surfaces of the molding part 116 may have the same inclination. In this exemplary embodiment, the molding part 116 has a rectangular parallelepiped shape. Thus, each of four side surfaces of the molding part 116 is a downwardly inclined surface (inc) and light emitted from the light emitting diode chip 112 can be discharged through the inclined surfaces (inc) of the molding part.

The graph of FIG. 21 depicts illuminance curves of the light emitting diode package 100 having a vertical side surface (ref.) and the light emitting diode package 100 having an inclined side surface (inc) downwardly inclined at an angle of 50 degrees. Referring to FIG. 21, it can be seen that light emitted from the light emitting diode package 100 having the downwardly inclined side surface (inc) is relatively broadly spread in the lateral direction. Particularly, it can be seen that the illuminance of light emitted from the light emitting diode package 100 having the downwardly inclined side surface is relatively high at points separated from the central point by 2 mm or more, indicating improvement in light spreading efficiency in the lateral direction.

Although the side surface of the molding part 116 of the light emitting diode package 100 is illustrated as having an inclination of 50 degrees in this exemplary embodiment, the inclination of the inclined side surface (inc) can be changed as needed. The light spreading efficiency of the light emitting diode package in the lateral direction can be improved by adjusting the inclination of the inclined side surface (inc) of the molding part 116.

Furthermore, the light emitting diode package 100 according to this exemplary embodiment has relatively low central illuminance due to spreading of light in the lateral direction thereof. As a result, the light emitting diode package 100 according to this exemplary embodiment can prevent generation of hot spots at the center thereof.

Figure 22:
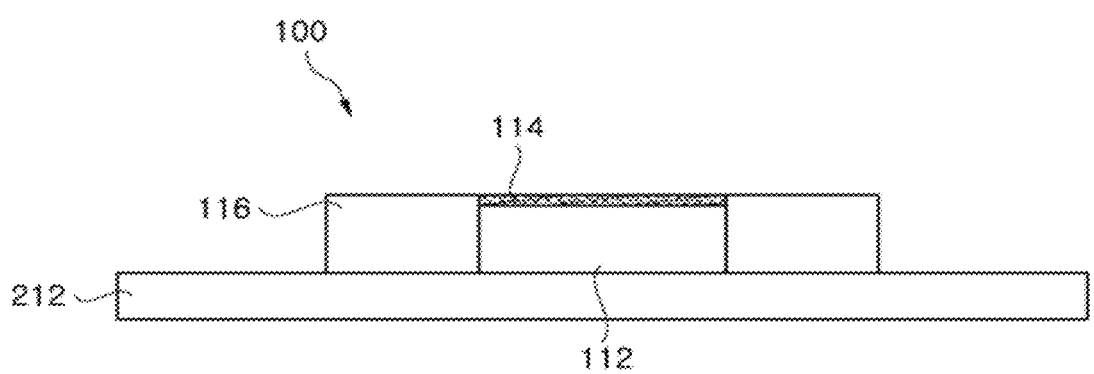
FIG. 22 is a sectional view of a light emitting package of a display apparatus according to a tenth exemplary embodiment.

FIG. 22 is a sectional view of a light emitting package of a display apparatus according to a tenth exemplary embodiment of the present disclosure.

Referring to FIG. 22, the light emitting diode package 100 includes a light emitting diode chip 112 disposed on a substrate 212, a reflector 114, and a molding part 116. Other components of the display apparatus 200 according to this exemplary embodiment are the same as those of the display apparatus according to the first exemplary embodiment and descriptions thereof will be omitted.

In the light emitting diode package 100 according to this exemplary embodiment, the reflector 114 is disposed on the light emitting diode chip 112 and the molding part 116 is disposed to surround side surfaces of the light emitting diode chip 112 and the reflector 114. The molding part 116 does not cover an upper surface of the light emitting diode chip 112, on which the reflector 114 is disposed, and may be disposed to surround the side surfaces of the light emitting diode chip 112 and the reflector 114. In addition, the molding part 116 does not cover the n-type electrode and the p-type electrode disposed on the lower side of the light emitting diode chip 112.

With this structure, light emitted from the side surface of the light emitting diode chip 112 can be discharged to the outside through the molding part 116.

In this exemplary embodiment, the reflector 114 can reflect the entirety or part of light emitted from the light emitting diode chip 112. When the reflector 114 has a reflectivity of 100%, light emitted from the light emitting diode chip 112 can be emitted only through the side surface thereof and can be finally discharged to the outside through the molding part 116. When the reflector 114 has a reflectivity of less than 100%, some fractions of light emitted through the upper surface of the light emitting diode chip 112 can be discharged through the reflector 114 and other fractions of the light can be discharged through the molding part 116 disposed on the side surface thereof.

As such, with the molding part 116 disposed only on the side surface of the light emitting diode chip 112, the light emitting diode package 100 according to this exemplary embodiment may have a smaller height than the light emitting diode package according to the first exemplary embodiment. As a result, in the display apparatus 200 having a relatively small OD, the light emitting diode package 100 according to this exemplary embodiment can replace a direct type backlight unit without using a separate lens.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A light emitting diode package, comprising:
   a light emitting diode chip;
   a reflector disposed on an upper surface of the light emitting diode chip and configured to reflect some light emitted from the light emitting diode chip; and
   a molding part disposed to cover an upper surface and a side surface of the light emitting diode chip and disposed to cover an upper surface and a side surface of the reflector,
   wherein the molding part has a smaller thickness measured from the upper surface of the reflector to an upper surface of the molding part than a width measured from each point of the side surface of the light emitting diode chip to a side surface of the molding part, and
   wherein the reflector comprises a distributed Bragg reflector.

2. The light emitting diode package according to claim 1, wherein the width of the molding part measured from the side surface of the light emitting diode chip to a side surface of the molding part is 1.5 to 4 times the thickness of the molding part measured from the upper surface of the reflector to the upper surface of the molding part.

3. The light emitting diode package according to claim 1, wherein the molding part comprises a phosphor and a light diffuser.

4. The light emitting diode package according to claim 1, wherein the reflector has a transmittance of 0% to 80% with respect to light emitted from the light emitting diode chip.

5. The light emitting diode package according to claim 1, wherein the molding part comprises:
   a first molding portion covering the upper surface and the side surface of the light emitting diode chip and covering the upper surface and the side surface of the reflector; and
   a second molding portion covering upper and side surfaces of the first molding portion.

6. The light emitting diode package according to claim 5, wherein at least one of the first molding portion and the second molding portion contains at least one kind of phosphor.

7. The light emitting diode package according to claim 6, wherein:
each of the first molding portion and the second molding portion contains at least one kind of phosphor, and
the first molding portion and the second molding portion contain different kinds of phosphors.

8. The light emitting diode package according to claim 5, wherein the second molding portion has a smaller thickness than the first molding portion.

9. The light emitting diode package according to claim 1, wherein the reflector comprises:
a first reflector disposed on a portion of the upper surface of the light emitting diode chip; and
a second reflector disposed on the upper surface of the light emitting diode chip to surround the first reflector.

10. The light emitting diode package according to claim 9, wherein the first reflector has a different reflectivity than the second reflector.

11. The light emitting diode package according to claim 10, wherein the first reflector has a lower reflectivity than the second reflector.

12. The light emitting diode package according to claim 1, wherein the side surface of the molding part is an inclined surface.

13. The light emitting diode package according to claim 12, wherein the inclined surface is a downwardly inclined surface.

14. A light emitting diode package, comprising:
a light emitting diode chip;
a reflector disposed on an upper surface of the light emitting diode chip and configured to reflect some light emitted from the light emitting diode chip; and
a molding part disposed on a side surface of the light emitting diode chip,
wherein a surface of the reflector is exposed outside of the molding part.

15. A display apparatus, comprising:
a frame;
a plurality of light emitting diode packages regularly arranged on the frame; and
an optical part disposed above the plurality of light emitting diode packages and comprising a display panel and at least one of a phosphor sheet and an optical sheet,
wherein each light emitting diode package, among the plurality of light emitting diode packages, comprises:
a light emitting diode chip;
a reflector disposed on an upper surface of the light emitting diode chip and configured to reflect some light emitted from the light emitting diode chip; and
a molding part disposed to cover an upper surface and a side surface of the light emitting diode chip and disposed to cover an upper surface and a side surface of the reflector,
wherein the molding part has a smaller thickness measured from the upper surface of the reflector to an upper surface of the molding part than a width measured from each point of the side surface of the light emitting diode chip to a side surface of the molding part, and
wherein the reflector comprises a distributed Bragg reflector.

16. The display apparatus according to claim 15, wherein a distance from the frame to the optical part is 1 mm to 15 mm.

17. The display apparatus according to claim 15, wherein the width of the molding part measured from the side surface of the light emitting diode chip to a side surface of the molding part is 1.5 to 4 times the thickness of the molding part measured from the upper surface of the reflector to the upper surface of the molding part.

18. The display apparatus according to claim 15, wherein the molding part comprises at least one of a phosphor and a light diffuser.

19. The display apparatus according to claim 15, wherein the reflector has a transmittance of 0% to 80% with respect to light emitted from the light emitting diode chip.

20. The display apparatus according to claim 15, wherein the molding part comprises:
a first molding portion covering the upper surface and the side surface of the light emitting diode chip and covering the upper surface and the side surface of the reflector; and
a second molding portion covering an upper surface and a side surface of the first molding portion.

21. The display apparatus according to claim 20, wherein at least one of the first molding portion and the second molding portion contains at least one kind of phosphor.

22. The display apparatus according to claim 20, wherein:
each of the first molding portion and the second molding portion contains at least one kind of phosphor, and
the first molding portion and the second molding portion contain different kinds of phosphors.

23. The display apparatus according to claim 20, wherein the second molding portion has a smaller thickness than the first molding portion.

24. The display apparatus according to claim 15, wherein the reflector comprises:
a first reflector disposed on a portion of the upper surface of the light emitting diode chip; and
a second reflector disposed on the upper surface of the light emitting diode chip to surround the first reflector.

25. The display apparatus according to claim 24, wherein the first reflector has a different reflectivity than the second reflector.

26. The display apparatus according to claim 25, wherein the first reflector has a lower reflectivity than the second reflector.

27. The display apparatus according to claim 15, wherein the side surface of the molding part is an inclined surface.

28. The display apparatus according to claim 27, wherein the inclined surface is a downwardly inclined surface.

29. The display apparatus according to claim 15, wherein the display apparatus excludes a lens.

30. A display apparatus, comprising:
a frame;
a plurality of light emitting diode packages regularly arranged on the frame; and
an optical part disposed above the plurality of light emitting diode packages and comprising a display panel and at least one of a phosphor sheet and an optical sheet,
wherein each light emitting diode package, among the plurality of light emitting diode packages comprises:
a light emitting diode chip;
a reflector disposed on an upper surface of the light emitting diode chip and configured to reflect some light emitted from the light emitting diode chip; and a molding part disposed on a side surface of the light emitting diode chip, wherein a surface of the reflector is exposed outside of the molding part.

31. The display apparatus according to claim 30, wherein the display apparatus excludes a lens.

* * * * *